(12) United States Patent
Lee et al.

(10) Patent No.: US 8,406,052 B2
(45) Date of Patent: Mar. 26, 2013

(54) HIGH VOLTAGE GENERATION AND CONTROL IN SOURCE-SIDE INJECTION PROGRAMMING OF NON-VOLATILE MEMORY

(75) Inventors: Dana Lee, Saratoga, CA (US); Hock So, Redwood City, CA (US)

(73) Assignee: SanDisk Technologies Inc., Plano, TX (US)

( * ) Notice: Subject to any disclaimer, the term of this patent is extended or adjusted under 35 U.S.C. 154(b) by 86 days.

(21) Appl. No.: 13/028,847

(22) Filed: Feb. 16, 2011

(65) Prior Publication Data

US 2011/0134694 A1 Jun. 9, 2011

Related U.S. Application Data

(62) Division of application No. 11/864,825, filed on Sep. 28, 2007, now Pat. No. 7,894,263.

(51) Int. Cl.
*G11C 16/04* (2006.01)

(52) U.S. Cl. ......... 365/185.03; 365/185.15; 365/185.17; 365/185.25

(58) Field of Classification Search .............. 365/185.03, 365/185.15, 185.17, 185.25
See application file for complete search history.

(56) References Cited

U.S. PATENT DOCUMENTS

| | | | |
|---|---|---|---|
| 5,313,421 A | 5/1994 | Guterman et al. | |
| 5,623,436 A | 4/1997 | Sowards et al. | |
| 5,712,180 A | 1/1998 | Guterman et al. | |
| 5,808,938 A | 9/1998 | Tran et al. | |
| 6,222,762 B1 | 4/2001 | Guterman et al. | |
| 6,597,036 B1 | 7/2003 | Lee et al. | |
| 6,859,397 B2 | 2/2005 | Lutze et al. | |
| 7,020,026 B2 | 3/2006 | Guterman et al. | |
| 7,057,931 B2 | 6/2006 | Lutze et al. | |
| 7,215,575 B2 | 5/2007 | Chen et al. | |
| 7,394,692 B2 | 7/2008 | Chen et al. | |
| 7,433,241 B2 | 10/2008 | Dong et al. | |
| 7,436,709 B2 | 10/2008 | Higashitani | |
| 7,447,065 B2 * | 11/2008 | Fong et al. | 365/185.02 |
| 7,471,566 B2 | 12/2008 | Hemink | |
| 7,499,336 B2 | 3/2009 | Liu et al. | |
| 7,499,338 B2 * | 3/2009 | Ito | 365/185.3 |
| 7,502,261 B2 | 3/2009 | Harari | |
| 7,515,463 B2 * | 4/2009 | Hemink | 365/185.02 |
| 7,583,531 B2 * | 9/2009 | Chen | 365/185.09 |
| 7,599,224 B2 * | 10/2009 | Lee | 365/185.22 |
| 7,894,263 B2 * | 2/2011 | Lee et al. | 365/185.17 |
| 2007/0217259 A1 | 9/2007 | Guterman et al. | |

(Continued)

OTHER PUBLICATIONS

Kurata, H., et al., "Constant-Charge-Injection Programming for 10MB/s Multilevel AG-AND Flash Memories," 2002 Symposium on VLSI Circuits Digest of Technical Papers, 2002, pp. 302-303.

(Continued)

*Primary Examiner* — Pho M Luu
(74) *Attorney, Agent, or Firm* — Vierra Magen Marcus LLP

(57) ABSTRACT

Non-volatile memory is programmed using source side hot electron injection. To generate a high voltage bit line for programming, the bit line corresponding to a selected memory cell is charged to a first level using a first low voltage. A second low voltage is applied to unselected bit lines adjacent to the selected bit line after charging. Because of capacitive coupling between the adjacent bit lines and the selected bit line, the selected bit line is boosted above the first voltage level by application of the second low voltage to the unselected bit lines. The column control circuitry for such a memory array does not directly apply the high voltage and thus, can be designed to withstand lower operating voltages, permitting low operating voltage circuitry to be used.

50 Claims, 16 Drawing Sheets

U.S. PATENT DOCUMENTS

2008/0084761 A1 4/2008 Lee et al.
2008/0151627 A1 6/2008 Lee et al.
2008/0151628 A1 6/2008 Lee et al.

OTHER PUBLICATIONS

Kurata, H., et al., "Constant-Charge-Injection Programming: A Novel High-Speed Programming Method for Multilevel Flash Memories," IEEE Journal of Solid-State Circuits, vol. 40, No. 2, Feb. 2005, pp. 523-531.

Lin, F., et al., "Novel Source-Controlled Self-Verified Programming for Multilevel EEPROM's," IEEE Transactions on Electron Devices, vol. 47, No. 6, Jun. 2000, pp. 1166-1174.

Kurara, H., et al., "Self-Boosted Charge Injection for 90-nm-node 4Gb Multilevel AG-AND Flash Memories Programmable at 16 MB/s," 2004 Symposium on VLSI Circuits Digest of Technical Papers, 2004, pp. 72-73.

Neugebauer, C., et al., "Electrically Erasable Buried-Gate Nonvolatile Read-only Memory," IEEE Transactions on Electron Devices, vol. ED-24, No. 5, May 1977, pp. 613-618.

Fujii, S., et al., "A 45-ns 16-Mbit DRAM with triple-well structure," IEEE Journal of Solid-State Circuits, vol. 24, No. 5, Oct. 1989, pp. 1170-1175.

U.S. Appl. No. 11/864,825, filed Sep. 28, 2007.

Restriction Requirement dated Nov. 13, 2009, United States Patent & Trademark Office, U.S. Appl. No. 11/864,825, filed Sep. 28, 2007.

Response to Restriction Requirement dated Dec. 14, 2009, U.S. Appl. No. 11/864,825, filed Sep. 28, 2007.

Non-Final Office Action dated Mar. 30, 2010, United States Patent & Trademark Office, U.S. Appl. No. 11/864,825, filed Sep. 28, 2007.

Response to Non-Final Office Action dated Jul. 28, 2010, U.S. Appl. No. 11/864,825, filed Sep. 28, 2007.

Notice of Allowance and Fee(s) Due dated Oct. 15, 2010, United States Patent & Trademark Office, U.S. Appl. No. 11/864,825, filed Sep. 28, 2007.

* cited by examiner

V(n0) = Vdd1+λVdd2
V(n1) = V(n0) when VpassD-Vt>V(n0)
(drain select gate not in saturation)

V(n0) = Vdd1+λVdd2
V(n1) = Vreg-Vt when V(n0)>Vreg-Vt
(drain select gate in saturation)

HIGH VOLTAGE GENERATION AND CONTROL IN SOURCE-SIDE INJECTION PROGRAMMING OF NON-VOLATILE MEMORY

CLAIM OF PRIORITY

This application is a divisional application of U.S. patent application Ser. No. 11/864,825, (now U.S. Pat. No. 7,894, 263), entitled "HIGH VOLTAGE GENERATION AND CONTROL IN SOURCE-SIDE INJECTION PROGRAMMING OF NON-VOLATILE MEMORY," filed Sep. 28, 2007 and incorporated herein by reference in its entirety.

BACKGROUND OF THE INVENTION

1. Field of the Invention

The present disclosure relates to programming in non-volatile memory.

2. Description of the Related Art

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM), including flash EEPROM, and Electronically Programmable Read Only Memory (EPROM) are among the most popular non-volatile semiconductor memories.

EEPROM and EPROM memories utilize a floating gate that is positioned above and insulated from a channel region in a semiconductor substrate. The floating gate is positioned between source and drain regions. A control gate is provided over and insulated from the floating gate. The threshold voltage of the transistor is controlled by the amount of charge that is retained on the floating gate. The minimum amount of voltage that must be applied to the control gate before the transistor is turned on to permit conduction between its source and drain is controlled by the level of charge on the floating gate.

One example of a flash memory system uses the NAND structure, which includes arranging multiple transistors in series between two select gates. The transistors in series and the select gates are referred to as a NAND string. FIG. 1 is a top view showing one NAND string and FIG. 2 is an equivalent circuit thereof. The NAND string depicted in FIGS. 1 and 2 includes four transistors 100, 102, 104 and 106 in series between a first select gate 120 and a second select gate 122. The drain select gate 120 connects the NAND string to bit line 126. The source gate 122 connects the NAND string to source line 128. Select gate 120 is controlled by applying appropriate voltages to control gate 120CG via selection line SGD. Select gate 122 is controlled by applying the appropriate voltages to control gate 122CG via selection line SGS. Each of the transistors 100, 102, 104 and 106 includes a control gate and a floating gate, forming the gate elements of a memory cell. Transistor 100 includes control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0. Another type of memory cell useful in flash EEPROM systems utilizes a non-conductive dielectric material in place of a conductive floating gate to store charge in a non-volatile manner.

Note that although FIGS. 1 and 2 show four memory cells in the NAND string, the use of four transistors is only provided as an example. A NAND string can have less than four memory cells or more than four memory cells. For example, some NAND strings will include eight memory cells, 16 memory cells, 32 memory cells, etc. The discussion herein is not limited to any particular number of memory cells in a NAND string and any described embodiments can be suitably incorporated into systems with any number of cells per string. Relevant examples of NAND-type flash memories and their operation are provided in the following U.S. patents/patent applications, all of which are incorporated herein by reference in their entirety: U.S. Pat. Nos. 5,570,315; 5,774,397; 6,046,935; 5,386,422; 6,456,528; and U.S. patent application Ser. No. 09/893,277 (Publication No. US2003/0002348).

A typical architecture for a flash memory system using a NAND structure will include several NAND strings. For example, FIG. 3 shows three NAND strings of a memory array having many more NAND strings. Each NAND string includes two select transistors or gates and four memory cells in FIG. 3. NAND string 190 includes select transistors 150 and 180, and memory cells 152, 154, 156 and 158. NAND string 192 includes select transistors 160 and 182, and memory cells 162, 164, 166 and 168. NAND string 194 includes select transistors 170 and 184, and memory cells 172, 174, 176, and 178. Each string is connected to the source line by one of source select gates 180, 182 and 184. Selection line SGS is used to control the source side select gates. The NAND strings are connected to respective bit lines by drain select gates 150, 160 and 170, which are controlled by selection line SGD. In other embodiments, the select lines do not necessarily need to be in common. Word line WL3 is connected to the control gates for memory cells 152, 162 and 172. Word line WL2 is connected to the control gates for memory cells 154, 164, and 174. Word line WL1 is connected to the control gates for memory cells 156, 166 and 176. Word line WL0 is connected to the control gates for memory cells 158, 168 and 178. A bit line and respective NAND string comprise a column of the array of memory cells. The word lines comprise the rows of the array. Each word line connects the control gates of each memory cell in the row. In some implementations, the word lines form the control gates of each memory cell in the row, while in others the word lines are formed separately and then connected to the control gates for a row of memory cells.

One programming methodology for EEPROM or flash memory devices uses Fowler Nordheim (FN) tunneling. IN FN programming a program voltage is typically applied to the control gate of a memory cell while the corresponding bit line is grounded. Electrons from the channel are injected into the floating gate. When electrons accumulate in the floating gate, the floating gate becomes negatively charged and the threshold voltage of the memory cell is raised so that the memory cell is in a programmed state. The floating gate charge and threshold voltage of the cell can be indicative of a particular state corresponding to stored data (analog or digital). More information about programming can be found in U.S. patent application Ser. No. 10/629,068, titled "Detecting Over Programmed Memory," filed on Jul. 29, 2003, incorporated herein by reference in its entirety.

A program voltage is applied on the appropriate word line to apply the program voltage to the control gate of the cell being programmed. As discussed above, that word line is also connected to one cell in each of the other NAND strings that utilize the same word line. For example, when programming cell 154 of FIG. 3, the program voltage will also be applied to the control gate of cells 164 and 174 because both cells share the same word line WL2. A problem arises when it's desired to program one cell on a word line without programming other cells connected to the same word line. Because the program voltage is applied to all cells connected to a word line, an unselected cell connected to the selected word line receiving the program voltage, especially a cell adjacent to the cell selected for programming, may be inadvertently programmed. The unintentional programming of the unselected cell on the selected word line is referred to as "program disturb."

Several techniques can be employed to prevent program disturb. In one method known as "self boosting," the channel areas of the unselected NAND strings are electrically isolated and a pass voltage (e.g. 10V) is applied to the unselected word lines during programming. The unselected word lines couple to the channel areas of the unselected NAND strings, causing a voltage (e.g. 8V) to be impressed in the channel and source/drain regions of the unselected NAND strings, thereby reducing program disturb. Self boosting causes a voltage boost to exist in the channel which lowers the voltage across the tunnel oxide and hence reduces program disturb.

Another programming methodology used in flash memory is source-side injection programming (SSI), which can offer some improvements over Fowler-Nordheim based programming. Lower programming currents and improvements in program disturb may be possible with SSI programming. In source-side injection (SSI) programming, a high voltage drain region at an injector gate excites hot electrons which are injected near the source side of a selected memory cell. A programming current from drain to source through the selected memory cell (e.g., memory cell 104) is induced by a high voltage drain region. The injector gate (e.g., memory cell 106) is turned on, causing a high electric field at its drain region. The drain region of the injector gate is near the source region of the selected memory cell, causing electrons to accumulate at the source side of the selected memory cell through hot electron injection. Although SSI programming offers some improvements over FN programming, its use in an array of memory cells can present difficulties.

SUMMARY OF THE INVENTION

Non-volatile memory is programmed using source side hot electron injection. To generate a high voltage bit line for programming, the bit line corresponding to a selected memory cell is charged to a first level using a first low voltage. A second low voltage is applied to unselected bit lines adjacent to the selected bit line after charging. Because of capacitive coupling between the adjacent bit lines and the selected bit line, the selected bit line is boosted above the first voltage level by application of the second low voltage to the unselected bit lines. The column control circuitry for such a memory array does not directly apply the high voltage and thus, can be designed to withstand lower operating voltages, permitting low operating voltage circuitry to be used.

Non-volatile memory is programmed using source side hot electron injection and a self-adjusting bit line voltage to control the rate of programming in one embodiment. Analog sensing of a selected storage element's threshold voltage controls the amount of pre-charge for a selected bit line. A pre-charge voltage is applied to a source line while applying the target threshold voltage to the control gate of a selected storage element. The corresponding bit line pre-charges to a level based on the actual threshold voltage of the selected storage element and the target threshold voltage. The bit line pre-charges to a lower level as the selected storage element's threshold voltage approaches the target level. After individually pre-charging a subset of bit lines in parallel, a low voltage is applied to a second subset of bit lines to boost the pre-charge levels on each bit line. The amount of pre-charge affects the final boosted level to provide a controlled rate of programming for a selected storage element.

In one embodiment, a method of programming non-volatile memory is provided that includes providing a first voltage to a first bit line adjacent to a second bit line, providing a second voltage to the second bit line after providing the first voltage to the first bit line to boost the first bit line above a level of the first voltage, providing a third voltage to a gate region of a selected non-volatile storage element in communication with the first bit line, and injecting electrons from a source side of the selected storage element into a charge storage region of the storage element.

A non-volatile memory system in accordance with one embodiment includes a first bit line, a first word line, a selected non-volatile storage element in communication with the first bit line and the first word line, and managing circuitry in communication with the first bit line and first word line. The managing circuitry boosts the first bit line above an applied voltage level by coupling to the first bit line a portion of a second voltage applied to a different electrical node of the memory system. The managing circuitry applies a program voltage to the selected word line during at least a portion of the boosting and programs the selected storage element by injecting electrons from a source side of the selected non-volatile storage element into a charge storage region of the selected storage element.

A method of programming non-volatile memory according to one embodiment includes pre-charging a bit line associated with a group of non-volatile storage elements based on a current threshold voltage of a selected non-volatile storage element of the group, boosting the bit line above a voltage level resulting from the pre-charging, and programming the selected non-volatile storage element by discharging the bit line through the group of non-volatile storage elements while applying a programming voltage to the selected storage element.

A non-volatile memory system according to one embodiment includes a group of non-volatile storage elements having a channel region, a bit line associated with the group of storage elements, and managing circuitry in communication with the group of storage elements and the bit line that programs a selected storage element of the group by source side injection. Source side injection programming includes sensing a threshold voltage of the selected storage element, charging the bit line based on the threshold voltage of the selected memory cell, boosting a voltage of the bit line after charging, and transferring at least a portion of the voltage of the bit line into the channel region of the group of storage elements to program the selected storage element.

DETAILED DESCRIPTION

Figure 4:
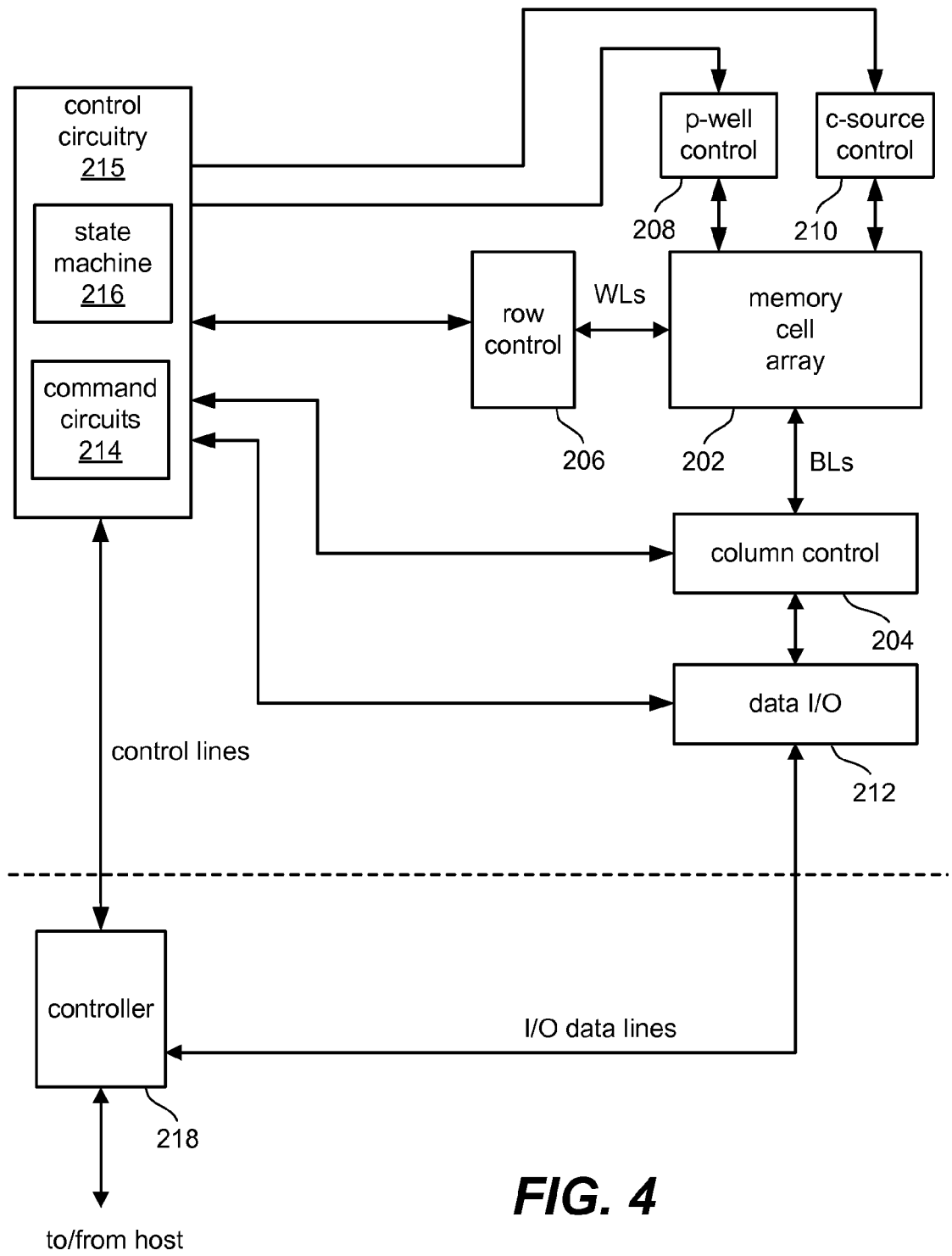
FIG. 4 is a block diagram of one embodiment of a non-volatile memory system.

FIG. 4 is a block diagram of one embodiment of a flash memory system that can be used to implement one or more embodiments of the present disclosure. FIG. 4 is exemplary as other systems can be used in accordance with various implementations. Memory cell array 202 is controlled by column control circuitry 204, row control circuitry 206, c-source control circuitry 208 and p-well control circuitry 208. Column control circuitry 204 is connected to the bit lines of memory cell array 202 for reading data stored in the memory cells, for determining a state of the memory cells during a program operation, and for controlling potential levels of the bit lines to promote or inhibit programming and erasing. Row control circuitry 206 is connected to the word lines to select one of the word lines, to apply read voltages, to apply program voltages combined with the bit line potential levels controlled by column control circuitry 204, and to apply an erase voltage. C-source control circuitry 210 controls a common source line (labeled as "C-source" in FIG. 5) connected to the memory cells. P-well control circuitry 208 controls the p-well voltage.

The data stored in the memory cells is read out by the column control circuitry 204 and output to external I/O lines via data input/output buffer 212. Program data to be stored in the memory cells is input to the data input/output buffer 212 via the external I/O lines, and transferred to the column control circuitry 204. The external I/O lines are connected to controller 218.

Command data for controlling the flash memory device is input to controller 218. The command data informs the flash memory of what operation is requested. The input command is transferred to state machine 216 which is part of control circuitry 215. State machine 216 controls column control circuitry 204, row control circuitry 206, c-source control 310, p-well control circuitry 208 and data input/output buffer 212. State machine 216 can also output status data of the flash memory such as READY/BUSY or PASS/FAIL.

Controller 218 is connected to or connectable with a host system such as a personal computer, a digital camera, or personal digital assistant, etc. It communicates with the host that initiates commands, such as to store or read data to or from the memory array 202, and provides or receives such data. Controller 218 converts such commands into command signals that can be interpreted and executed by command circuits 214 which are part of control circuitry 215. Command circuits 214 are in communication with state machine 216. Controller 218 typically contains buffer memory for the user data being written to or read from the memory array.

One exemplary memory system comprises one integrated circuit that includes controller 218, and one or more integrated circuit chips that each contain a memory array and associated control, input/output and state machine circuits. There is a trend to integrate the memory arrays and controller circuits of a system together on one or more integrated circuit chips. The memory system may be embedded as part of the host system, or may be included in a memory card (or other package) that is removably inserted into the host systems. Such a card may include the entire memory system (e.g. including the controller) or just the memory array(s) with associated peripheral circuits (with the controller or control function being embedded in the host). Thus, the controller can be embedded in the host or included within the removable memory system.

In some implementations, some of the components of FIG. 4 can be combined. In various designs, one or more of the components of FIG. 4, other than memory cell array 202, can be thought of as managing circuitry for the memory system. For example, one or more managing circuits may include any one or a combination of a command circuit, a state machine, a row control circuit, a column control circuit, a well control circuit, a source control circuit, a data I/O circuit, or a controller.

Figure 5:
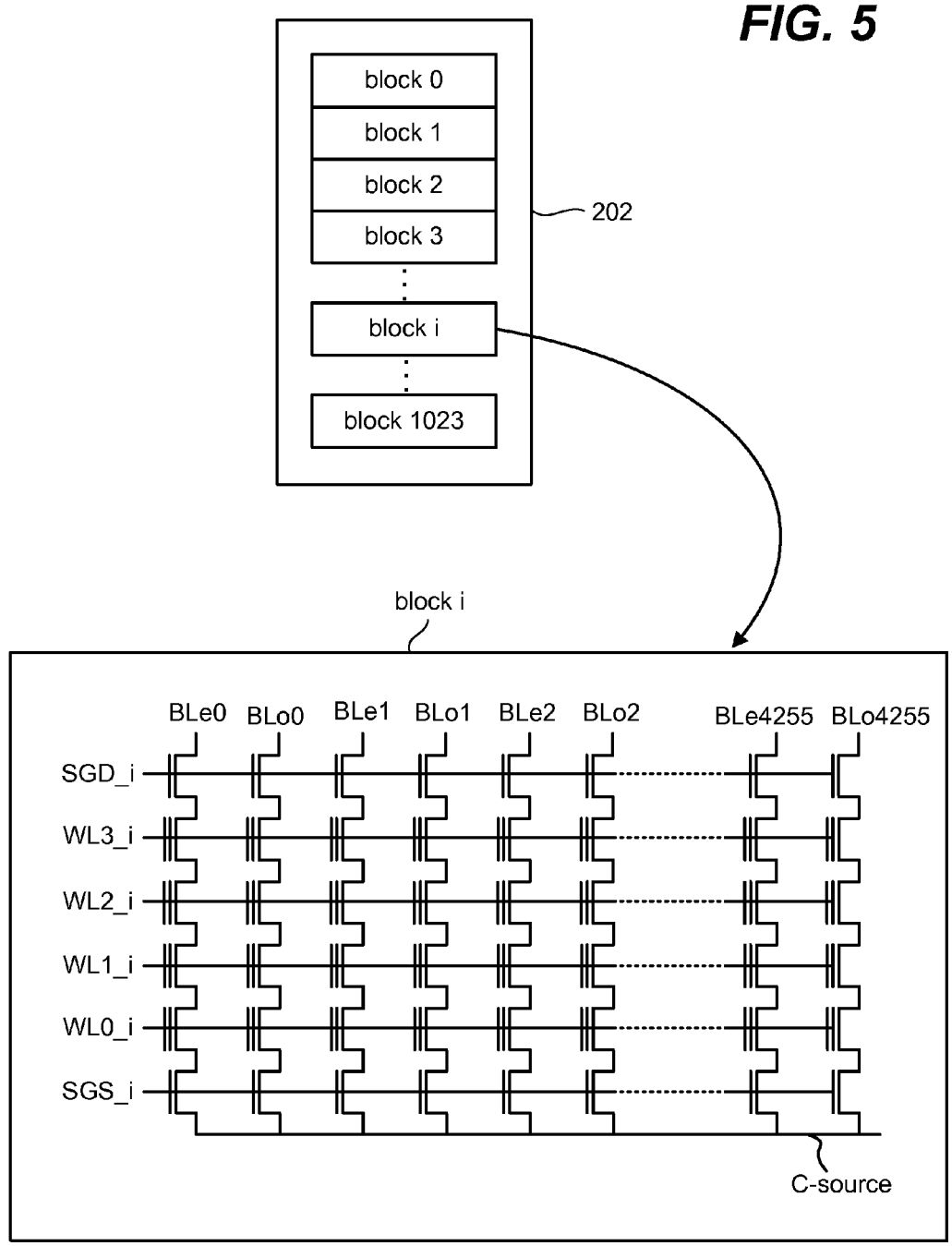
FIG. 5 illustrates an exemplary organization of a memory array.

With reference to FIG. 5, an exemplary structure of memory cell array 202 is described. In this example, a NAND flash EEPROM is described that is partitioned into 1,024 blocks. The data stored in each block is simultaneously erased. In one embodiment, the block is the minimum unit of cells that are simultaneously erased. Each block is typically divided into a number of pages which can be a unit of programming. Other units of data for programming are also possible and contemplated. In one embodiment, individual pages may be divided into segments and the segments may contain the fewest number of cells that are written at one time as a basic programming operation. One or more pages of data are typically stored in one row of memory cells.

In each block of the example in FIG. 5 there are 8,512 columns that are divided into even columns and odd columns. The bit lines are also divided into even bit lines (BLe) and odd bit lines (BLo). In an odd/even bit line architecture, memory cells along a common word line and connected to the odd bit lines are programmed at one time, while memory cells along a common word line and connected to even bit lines are programmed at another time. Although four cells are shown to be included in each NAND string in FIG. 5, more or less than four memory cells can be used. One terminal of the NAND string is connected to a corresponding bit line via a first select transistor that is connected to a drain select gate control line SGD, and another terminal is connected to C-source via a second select transistor that is connected to a source select gate control line SGS.

In other embodiments, the bit lines are not divided into odd and even bit lines. Such architectures are commonly referred to as all bit line architectures. In an all bit line architecture, all the bit lines of a block are simultaneously selected during read and program operations. Memory cells along a common word line and connected to any bit line are programmed at the same time.

During one embodiment of read and programming operations in an odd/even bit line architecture, 4,256 memory cells are simultaneously selected. The memory cells selected have the same word line and the same kind of bit line (e.g. even bit lines or odd bit lines). Therefore, 532 bytes of data can be read or programmed simultaneously. These 532 bytes of data that are simultaneously read or programmed form a logical page. Therefore, one block can store at least eight logical pages (four word lines, each with odd and even pages). When each memory cell stores two bits of data (e.g., multi-state memory cells), wherein each of these two bits are stored in a different page, one block stores 16 logical pages. Other block and page sizes can also be used. Additionally, architectures other than that of FIGS. 4 and 5 can also be used with embodiments of the present disclosure.

When programming a memory cell in one example, the control gate receives a series of programming pulses with increasing magnitudes. The magnitudes of the pulses in the series may range from 12V to 24V for example. The range of pulses in the series can be different, for example, having a starting level higher or lower than 12V. During programming, verify operations are carried out in the periods between the programming pulses. The programming level of each cell of a group of cells programmed in parallel is read between each programming pulse to determine whether or not it has reached or exceeded a verify level to which it is being programmed. One means of verifying programming is to test conduction at a specific compare point. The cells that are verified to be sufficiently programmed are locked out for subsequent programming pulses to terminate the programming process for those cells. In some cases, the number of pulses is limited (e.g. 20 pulses) and if a given memory cell is not sufficiently programmed by the last pulse, an error is assumed. In some implementations, memory cells are erased (in blocks or other units) prior to programming.

Figure 1:
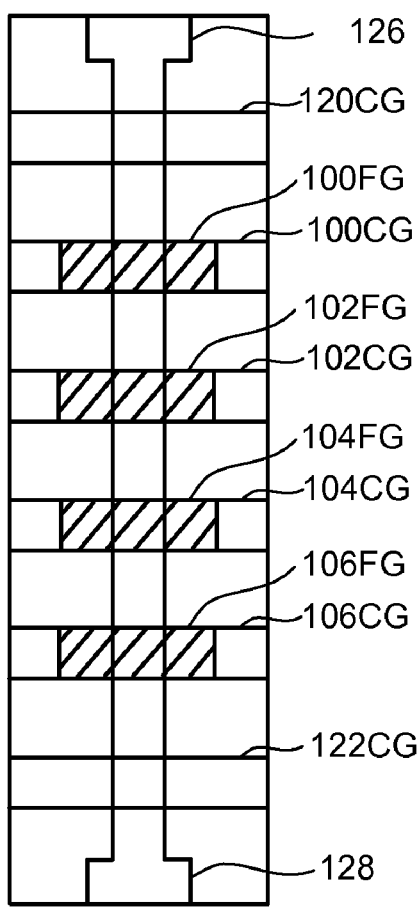
FIG. 1 is a top view of a NAND string.
Figure 2:
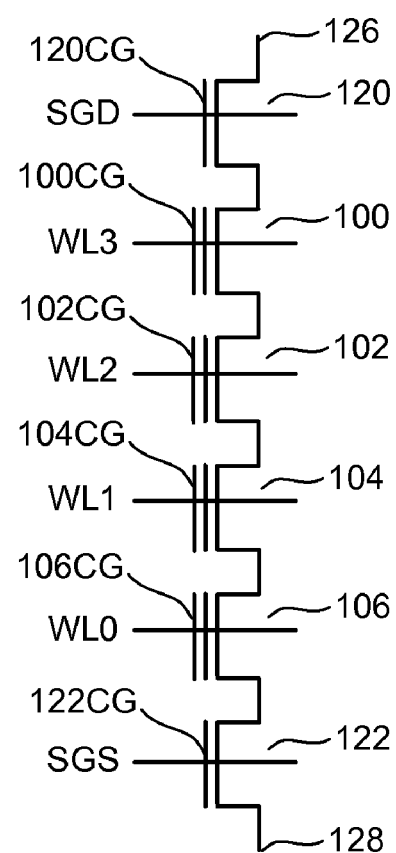
FIG. 2 is an equivalent circuit diagram of the NAND string of FIG. 1.
Figure 3:
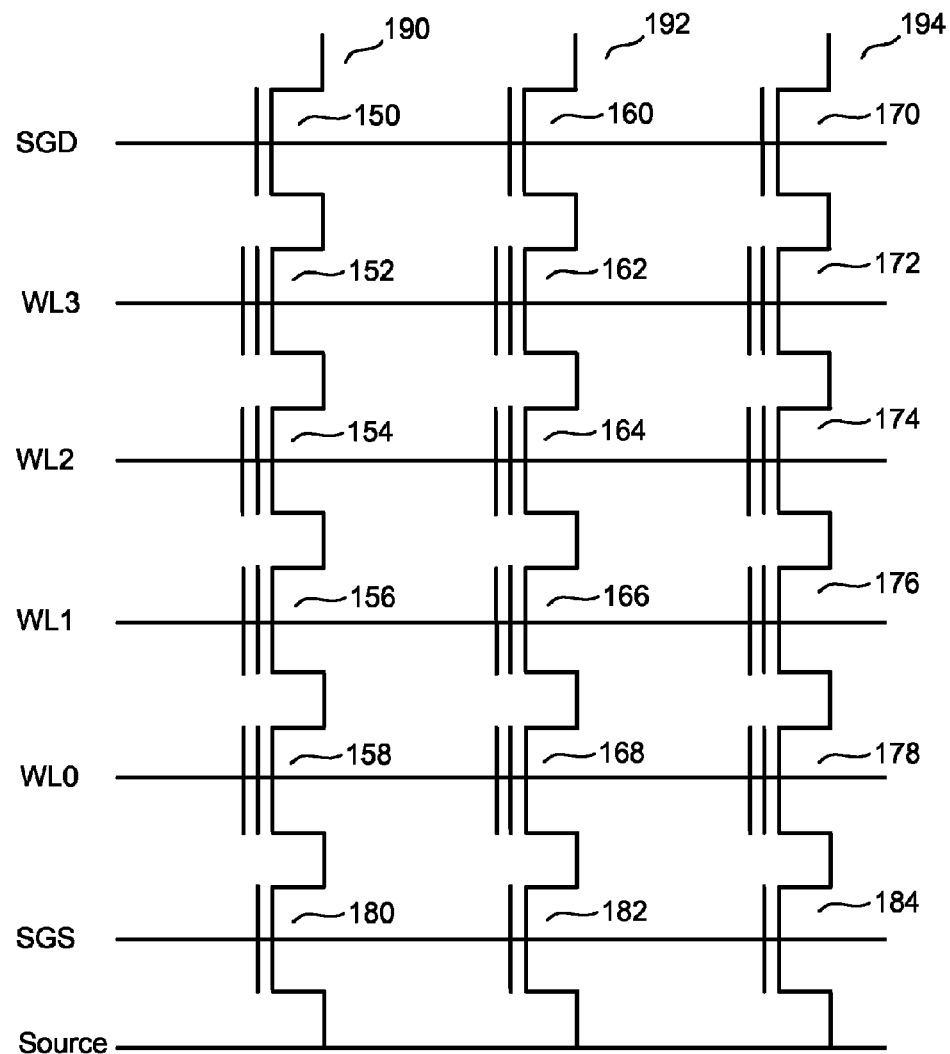
FIG. 3 is a circuit diagram of a portion of a memory including three NAND strings such as those of FIGS. 1 and 2.
Figure 6:
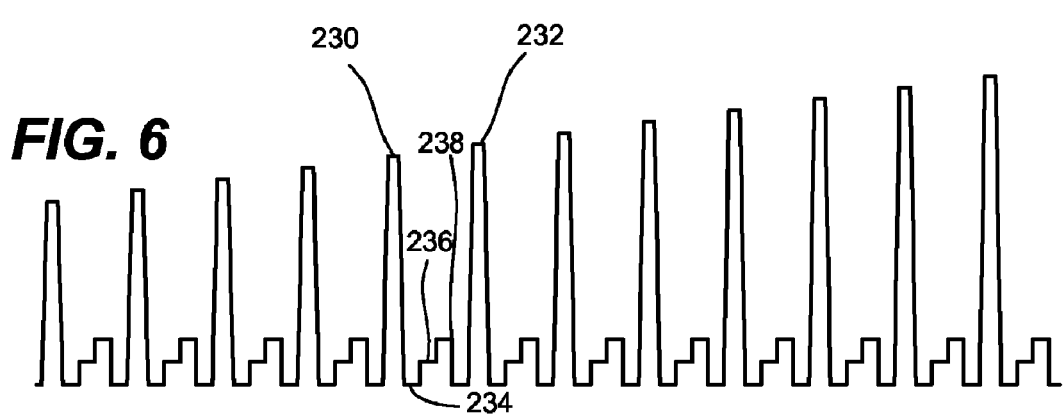
FIG. 6 depicts a program voltage signal, including verify pulses, that can be used in accordance with one embodiment.

FIG. 6 depicts a program voltage signal in accordance with one embodiment. This signal has a set of pulses with increasing magnitudes. The magnitude is increased with each pulse by a predetermined step size. In one embodiment that includes the memory cells storing multiple bits of data, an exemplary step size is 0.2V (or 0.4V). Between each of the program pulses are verify pulses. The signal of FIG. 6 assumes a four state memory cell, therefore, it includes three verify pulses. For example, between programming pulses 230 and 232 are three sequential verify pulses. The first verify pulse 234 is depicted at a zero volt verify voltage level. The second verify pulse 236 follows the first verify pulse at the second verify voltage level. The third verify pulse 238 follows the second verify pulse 236 at the third verify voltage level. A multi-state memory cell capable of storing data in eight states may need to perform verify operations at seven compare points. Seven verify pulses are applied in sequence to perform seven verify operations at seven verify levels between two consecutive programming pulses. Based on the seven verify operations, the system can determine the state of the memory cells. One means for reducing the time burden of verifying is to use a more efficient verify process, for example, as disclosed in: U.S. patent application Ser. No. 10/314,055, entitled "Smart Verify for Multi-State Memories," filed Dec. 5, 2002; U.S. patent application Ser. No. 11/259,799, entitled "Method for Programming of Multi-State Non-Volatile Memory Using Smart Verify, filed Oct. 27, 2005; and U.S. patent application Ser. No. 11/260,658, entitled "Apparatus for Programming of Multi-State Non-Volatile Memory Using Smart Verify," filed Oct. 27, 2005, all of which are incorporated herein by reference in their entirety.

Figure 8:
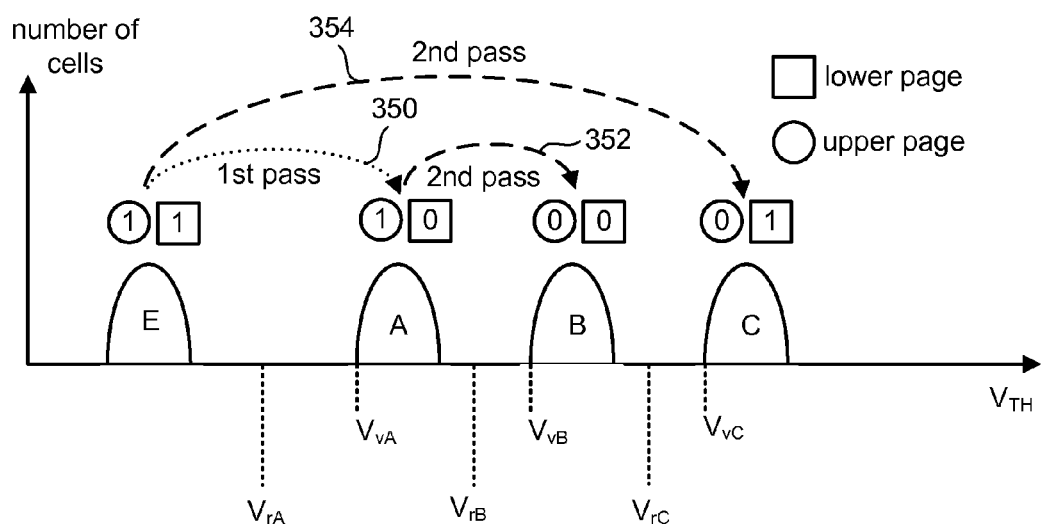
FIG. 8 depicts an exemplary set of threshold voltage distributions and a two-pass programming process.

At the end of a successful program process, the threshold voltages of the memory cells should be within one or more distributions of threshold voltages for programmed memory cells or within a distribution of threshold voltages for erased memory cells, as appropriate. FIG. 8 illustrates threshold voltage distributions for the memory cell array when each memory cell stores two bits of data. FIG. 8 shows a first threshold voltage distribution E for erased memory cells. Three threshold voltage distributions, A, B and C for programmed memory cells, are also depicted. In one embodiment, the threshold voltages in the E distribution are negative and the threshold voltages in the A, B and C distributions are positive.

Figure 7:
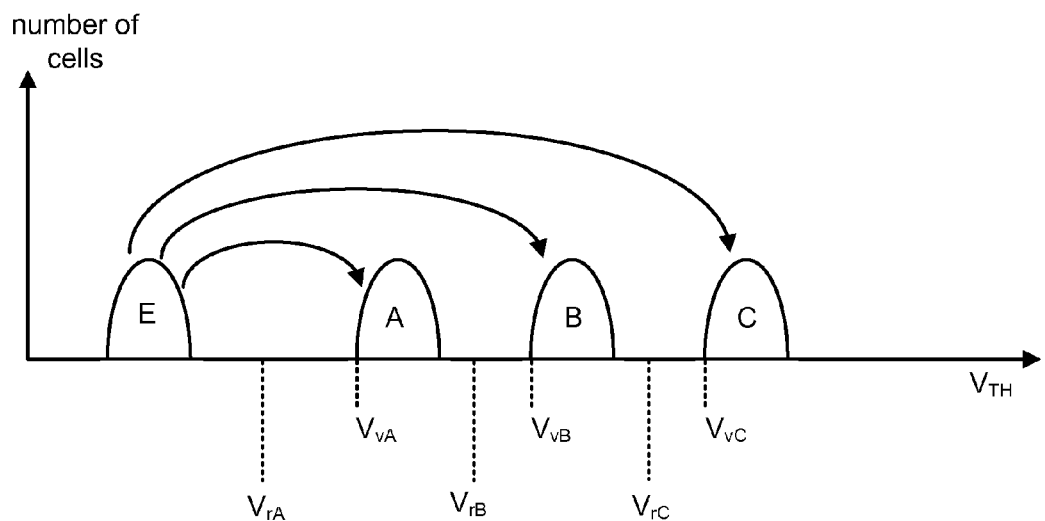
FIG. 7 depicts an exemplary set of threshold voltage distributions and a full sequence programming process.

Each distinct threshold voltage range of FIG. 7 corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a gray code assignment so that if the threshold voltage of a floating gate erroneously shifts to its neighboring physical state, only one bit will be affected. However, in other embodiments, gray coding is not used. One example assigns "11" to threshold voltage range E (state E), "10" to threshold voltage range A (state A), "00" to threshold voltage range B (state B) and "01" to threshold voltage range C (state C). Although FIG. 8 shows four states, embodiments in accordance of the present disclosure can include other multi-state structures including those that include more or less than four states.

FIG. 7 also depicts an embodiment that utilizes full sequence programming. In full sequence programming, memory cells can be programmed from the erased state E directly to any of the programmed states A, B or C. For example, a population of memory cells to be programmed may first be erased so that all memory cells in the population are in erased state E. A series of program voltage pulses applied to the control gates of selected memory cells will be used to program the memory cells directly into states A, B or C. While some memory cells are being programmed from state E to state A, other memory cells are being programmed from state E to state B and/or from state E to state C.

FIG. 8 illustrates an example of a two-pass technique of programming a multi-state memory cell that stores data for two different pages: a lower page and an upper page. Four states are depicted: state E (11), state A (10), state B (00) and state C (01). For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned. In a first programming pass, the cell's threshold voltage level is set according to the bit to be programmed into the lower logical page. If that bit is logic "1," the threshold voltage is not changed since it is in the appropriate state as a result of having been earlier erased. However, if the bit to be programmed is logic "0," the threshold level of the cell is increased to be state A, as shown by arrow 350. That concludes the first programming pass.

In a second programming pass, the cell's threshold voltage level is set according to the bit being programmed into the upper logical page. If the upper logical page bit is to store a logic "1," then no programming occurs since the cell is in one of the states E or A, depending upon the programming of the lower page bit, both of which carry an upper page bit of "1." If the upper page bit is to be logic "0," then the threshold voltage is shifted. If the first pass resulted in the cell remaining in the erased state E, then in the second phase the cell is programmed so that the threshold voltage is increased to be within state C, as depicted by arrow 354. If the cell had been programmed into state A as a result of the first programming pass, then the memory cell is further programmed in the second pass so that the threshold voltage is increased to be within state B, as depicted by arrow 352. The result of the second pass is to program the cell into the state designated to store logic "0" for the upper page without changing the data for the lower page.

Verify levels $V_{vA}$, $V_{vB}$, and $V_{vC}$ are used to verify programming of cells to states A, B, and C, respectively in FIGS. 7 and 8. Read reference voltages, $V_{rA}$, $V_{rB}$ and $V_{rC}$ are used for reading data from memory cells programmed as shown in FIGS. 7 and 8. Cells to be programmed to state A receive programming pulses until they are non-conductive under an applied control gate voltage of $V_{vA}$. Cells for a threshold voltage at or above $V_{vB}$, and cells to be programmed to state C are verified using $V_{vC}$. When reading, the system tests whether the threshold voltage of a given memory cell is above or below $V_{rA}$, $V_{rB}$ and $V_{rC}$. A cell that conducts with an applied control gate voltage of $V_{rA}$ is in state E, a cell that conducts at $V_{rB}$ but not $V_{rA}$ is in state A, a cell that conducts at $V_{rC}$ but not $V_{rB}$ is in state B, and a cell that does not conduct at $V_{rA}$, $V_{rB}$ or $V_{rC}$ is in state C.

In read and verify operations, the select gates of a selected block are raised to one or more select voltages and the unselected word lines (e.g., WL0, WL2 and WL3) are raised to a read pass voltage Vread (e.g. 4.5 volts) to make the transistors operate as pass gates. The source and p-well are at zero volts. The selected bit lines (BLe) are pre-charged to a level of, for example, 0.7V. The selected word line (e.g. WL1) is connected to a read or verify voltage, a level of which is specified for each read and verify operation as just described in order to determine whether a threshold voltage of the concerned memory cell is above or below such level. If the threshold voltage is higher than the read or verify level on the word line, the potential level of the bit line (BLe) associated with the cell of interest maintains the high level because of the non-conductive memory cell. On the other hand, if the threshold voltage is lower than the read or verify level, the potential level of the concerned bit line (BLe) decreases to a low level, for example less than 0.5V, because of the conductive memory cell discharging the bitline. The state of the memory cell is thereby detected by a voltage comparator sense amplifier that is connected to the bit line to sense the resulting bit line voltage. The erase, read and verify operations described above are performed according to techniques known in the art. Thus, many of the details explained can be varied by one skilled in the art. Other erase, read and verify techniques such as current sensing known in the art can also be used.

Figure 9:
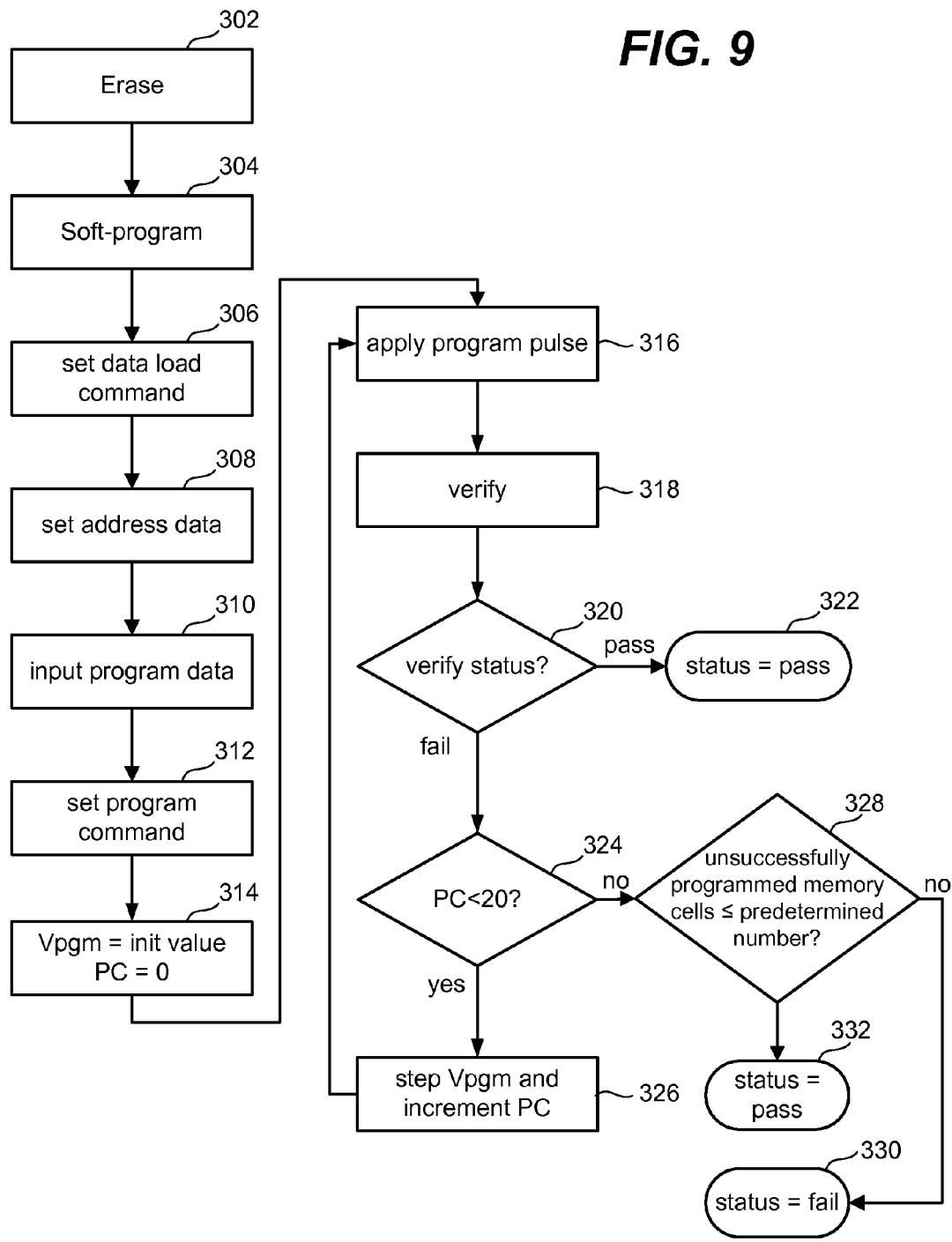
FIG. 9 is a flowchart describing a method of programming non-volatile memory in accordance with one embodiment.

FIG. 9 is a flow chart describing one embodiment of a method for programming non-volatile memory. The memory cells to be programmed are erased at step 302. Step 302 can include erasing more memory cells than those to be programmed (e.g., in blocks or other units). At step 302, soft programming is performed to narrow the distribution of erased threshold voltages for the erased memory cells. Some memory cells may be in a deeper erased state than necessary as a result of the erase process. Soft programming can apply small programming pulses to move the threshold voltage of the erased memory cells closer to the erase verify level. At step 306, a "data load" command is issued by controller 218 and input to command circuits 214, allowing data to be input to data input/output buffer 212. The input data is recognized as a command and latched by state machine 216 via a command latch signal, not illustrated, input to command circuits 214. At step 308, address data designating the page address is input to row controller or decoder 206 from the controller or host. The input data is recognized as the page address and latched via state machine 216, affected by the address latch signal input to command circuits 214. At step 310, a page of program data for the addressed page is input to data input/output buffer 212 for programming. For example, 532 bytes of data could be input in one embodiment. That data is latched in the appropriate registers for the selected bit lines. In some embodiments, the data is also latched in a second register for the selected bit lines to be used for verify operations. At step 312, a "program" command is issued by the controller and input to data input/output buffer 212. The command is latched by state machine 216 via the command latch signal input to command circuits 214.

Triggered by the "program" command, the data latched in step 310 will be programmed into the selected memory cells controlled by state machine 216. At step 314, Vpgm, the programming pulse voltage level applied to the selected word line, is initialized to the starting pulse (e.g., 12V) and a program counter PC maintained by state machine 216 is initialized at 0. At step 316, the first Vpgm pulse is applied to the selected word line.

In one embodiment, logic "0" is stored in a particular data latch for a bit line to indicate that a corresponding memory cell at the selected word line should be programmed. In FN programming, the corresponding bit line will be grounded during the programming iteration in response to logic '0' to promote or enable programming of the corresponding memory cell. In one embodiment of SSI injection programming, a high voltage is applied to the bit line of a cell to be programmed to promote or enable programming for the corresponding memory cell. The high voltage can be applied to the source line in other SSI embodiments. Logic "1" is stored in a particular data latch to indicate that the corresponding memory cell should remain in its current data state in one embodiment. The corresponding bit line is connected to Vdd to inhibit programming in FN tunneling programming. The bit line is grounded in some SSI implementations to inhibit programming, while in others, the bit line is held at Vdd to inhibit programming.

At step 318, the states of the selected memory cells are verified. If it is detected that the target threshold voltage of a selected cell has reached the appropriate level, then the data stored in the corresponding data latch is changed to a logic "1." If it is detected that the threshold voltage has not reached the appropriate level, the data stored in the corresponding data latch is not changed. In this manner, a bit line having a logic "1" stored in its corresponding data latch does not need to be programmed. When all of the data latches are storing logic "1," the state machine knows that all selected cells have been programmed. At step 320, it is checked whether all of the data latches are storing logic "1." If so, the programming process is complete and successful because all selected memory cells were programmed and verified to their target states. A status of pass is reported at step 322.

If at step 320, it is determined that not all of the data latches are storing logic "1," then the programming process continues. At step 324, the program counter PC is checked against a program limit value. One example of a program limit value is 20, however, other values can be used in various implementations. If the program counter PC is not less than the limit, then it is determined at step 328 whether the number of bits that have not been successfully programmed is equal to or less than a predetermined number. If the number of unsuccessfully programmed bits is equal to or less than the predetermined number, then the programming process is flagged as passed and a status of pass is reported at step 332. The bits that are not successfully programmed can be corrected using error correction during the read process. If however, the number of unsuccessfully programmed bits is greater than the predetermined number, the program process is flagged as failed and a status of fail is reported at step 330. If the program counter PC is less than 20, then the Vpgm level is increased by the step size and the program counter PC is incremented at step 326. After step 326, the process loops back to step 316 to apply the next Vpgm pulse. In a two-pass programming method multiple programming or verification steps may be used in a single iteration of the method described in FIG. 9. Steps 314-332, for example, may be performed for each pass of the programming operation. In a first pass, one or more program pulses may be applied and the results thereof verified to determine if a cell is in the appropriate intermediate state. In a second pass, one or more program pulses may be applied and the results thereof verified to determine if the cell is in the appropriate final state. In some embodiments, this technique may include separate data load and program commands as well as separate inputs of address and program data as shown in steps 306-312.

In SSI programming, electrons are injected at the source side of the floating gate of a selected memory cell. SSI programming traditionally uses a directly contacted gate to serve as an injector gate for programming the selected memory cell. In a NAND memory array, however, each memory cell is adjacent to one or more other memory cells and/or a select gate. There is no dedicated or directly contacted gate to server as an injector. In NAND type memory, the memory cell adjacent to the selected memory cell in the bit line direction can be used as an injector gate, with the select gate serving as the injector for the first memory cell at word line WL0. A high voltage drain region is established at the injector gate by providing a high voltage bit line. The program voltage is applied at the selected word line and the adjacent gate turned on to excite electrons at the drain region of the adjacent gate. With a drain to source current flowing through the selected cell, the adjacent gate serves as an injector. The injector gate is placed into saturation with a high voltage at its drain region. With a current flowing from the high voltage drain to the low voltage source of the string, hot electrons are injected at the source side of the selected memory cell.

Figure 10:
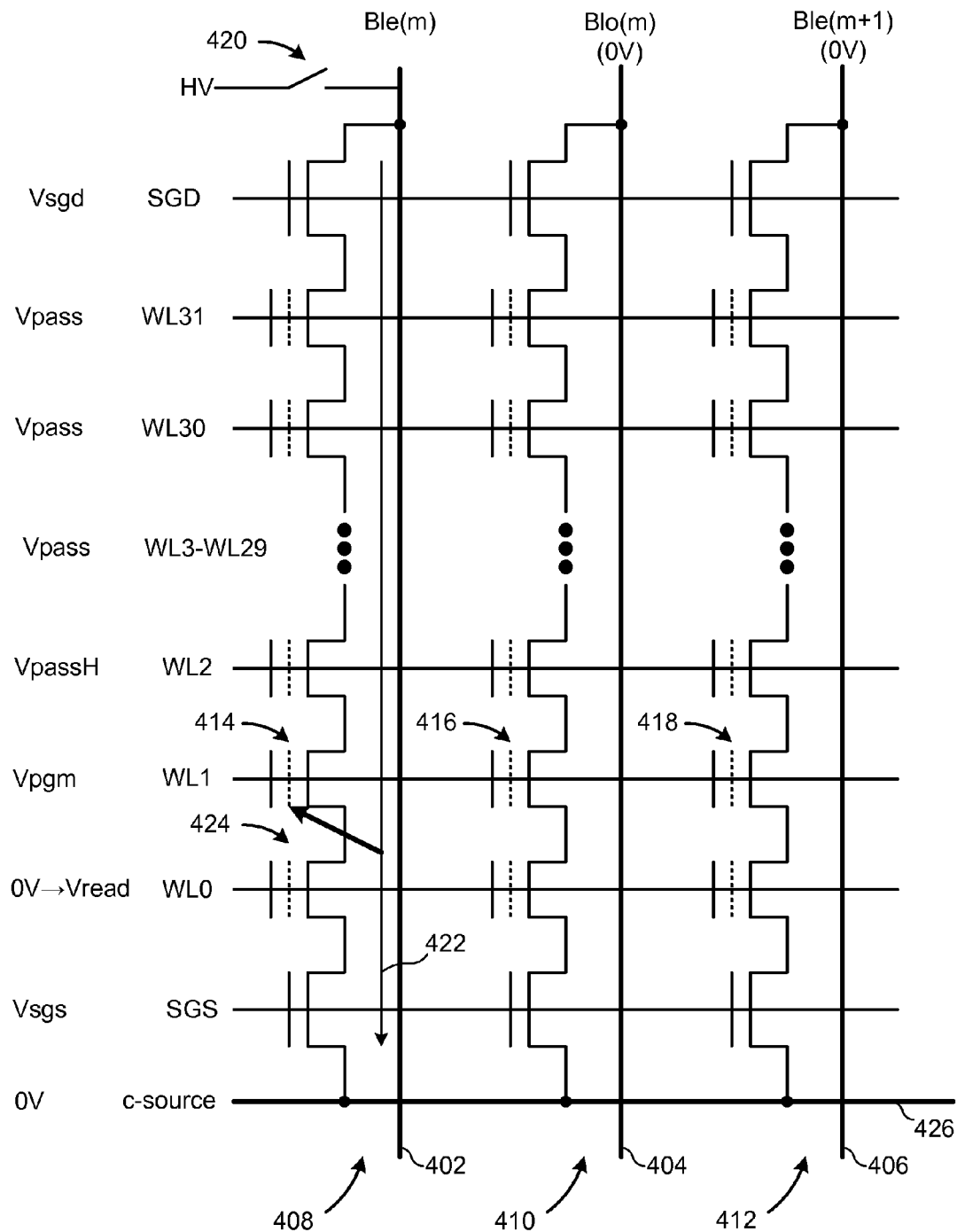
FIG. 10 is a circuit diagram of a portion of a memory array biased for source side injection programming.

FIG. 10 depicts a portion of a NAND memory array that is biased for source side injection programming. Word line WL1 is selected for programming and connects to a memory cell 414 of a first NAND string 408, a second memory cell 416 of a second NAND string 410 and a third memory cell 418 of a third NAND string 412. NAND string 408 connects to even bit line 402, NAND string 410 connects to odd bit line 404, and NAND string 412 connects to even bit line 406. The even bit lines are currently selected for programming. Memory cell 414 is to be programmed and memory cell 418 is to be inhibited from programming. In the provided example, programming begins at the source side of the string with word line WL0 and ends at the drain side with word line WL31.

The select gates of each NAND string are opened by applying Vsgs to the source selection line SGS and Vsgd to the drain selection line SGD. A controlled on-chip voltage Vdd (e.g., 2.5V-3.3V) is used for Vsgs and Vsgd in one embodiment. A voltage higher than Vdd is used for Vsgd in one embodiment to ensure that the full bit line potential is transferred through the drain select gate and into the NAND string. A Vsgd equal to about 8V, for example, may be used in one embodiment. Variations to these voltage levels can be used in embodiments to control a level of bit line pre-charge as will be hereinafter described.

The unselected word lines except for source side neighboring word line WL0 receive a pass voltage. The pass voltage level can vary by implementation and different values can be used for different word lines in a single implementation. In the disclosed embodiment, word line WL2 is adjacent to selected word line WL1 in the bit line direction and receives a higher level pass voltage VpassH while the remaining unselected word lines receive pass voltage Vpass. This implementation may be used in embodiments where word line WLn+1 is programmed with respect to a first logical page prior to programming word line WLn with respect to a second logical page. Vpass is set to the read pass voltage Vread (e.g, 5V) and VpassH is about 16V in one exemplary embodiment. In another embodiment, the word lines on the source side of the selected word line can receive a first pass voltage (e.g., VpassL=Vread) and the word lines on the bit line side receive a second pass voltage (e.g., VpassH=Vpgm).

Even bit line 402 connects to cell 414 and is selected during the programming operation. A high voltage HV is applied by closing switch 420. Memory cell 418 is not to be programmed so even bit line 406 is unselected by remaining at 0V. The odd bit lines also remain at 0V to inhibit programming in the corresponding NAND strings. The common source line is at 0V. Selected word line WL1 receives the program voltage signal Vpgm. Word line WL0 is adjacent to selected word line WL1 in the source direction and connects to cell memory 424. Memory cell 424 serves as the injector gate for programming cell 414. Word line WL0 is swept from 0V to read pass voltage Vread while Vpgm is applied to word line WL1. Depending on its current state, cell 424 will turn as WL0 is swept from 0V to Vread. When cell 424 turns on, a current is induced from bit line 402 to source line 426 through NAND string 408. At a particular control gate voltage in this range, cell 424 will excite electrons for injection at cell 414. This particular voltage can vary by implementation and even between individual cells in a given implementation. Word line WL0 can be swept in one embodiment to ensure the particular voltage that will excite the electrons is applied.

With the memory cell at word line WL0 in an on state, the high voltage HV on bit line 402 is transferred into the channel region of NAND string 408. The high voltage is present at the source side of memory cell 414 and the drain side of injector gate 424. The programming voltage Vpgm is applied to the selected word line WL1 causing a high electric field at the drain region of injector gate 424. Hot electrons are excited by the strong electric field present at the drain region of memory cell 414. The hot electrons are injected at the source side of the floating gate of selected memory cell 414. The unselected NAND strings 410 and 412 remain at 0V to inhibit programming of memory cells 416 and 418.

In many respects, FN tunneling has been the predominant programming technique used in commercial devices. Accordingly, many non-volatile memory array architectures have been designed for FN tunneling programming. FN programming traditionally operates at bit line voltages of 0V and Vdd (e.g., 2.5V-3.5V) to enable and inhibit programming, respectively, for a memory cell at the selected word line. In such cases, the control circuitry for selecting and routing voltages to the bit lines needs to only handle or otherwise operate at these low voltage levels. In source side injection programming as shown in FIG. 10, however, a high voltage is applied to a selected bit line during programming. The level of the voltage can vary by implementation but is generally around 3V-6V to promote programming. If a high voltage is generated on chip and routed to a selected bit line for source side injection programming, the column control circuitry for the bit lines needs to withstand these high voltage levels. In many instances, this would require a complete redesign of the column control circuitry. The transistors of a column control circuitry designed for FN tunneling applications may not be suitable for the high bit line voltage needed for SSI applications.

Figure 11:
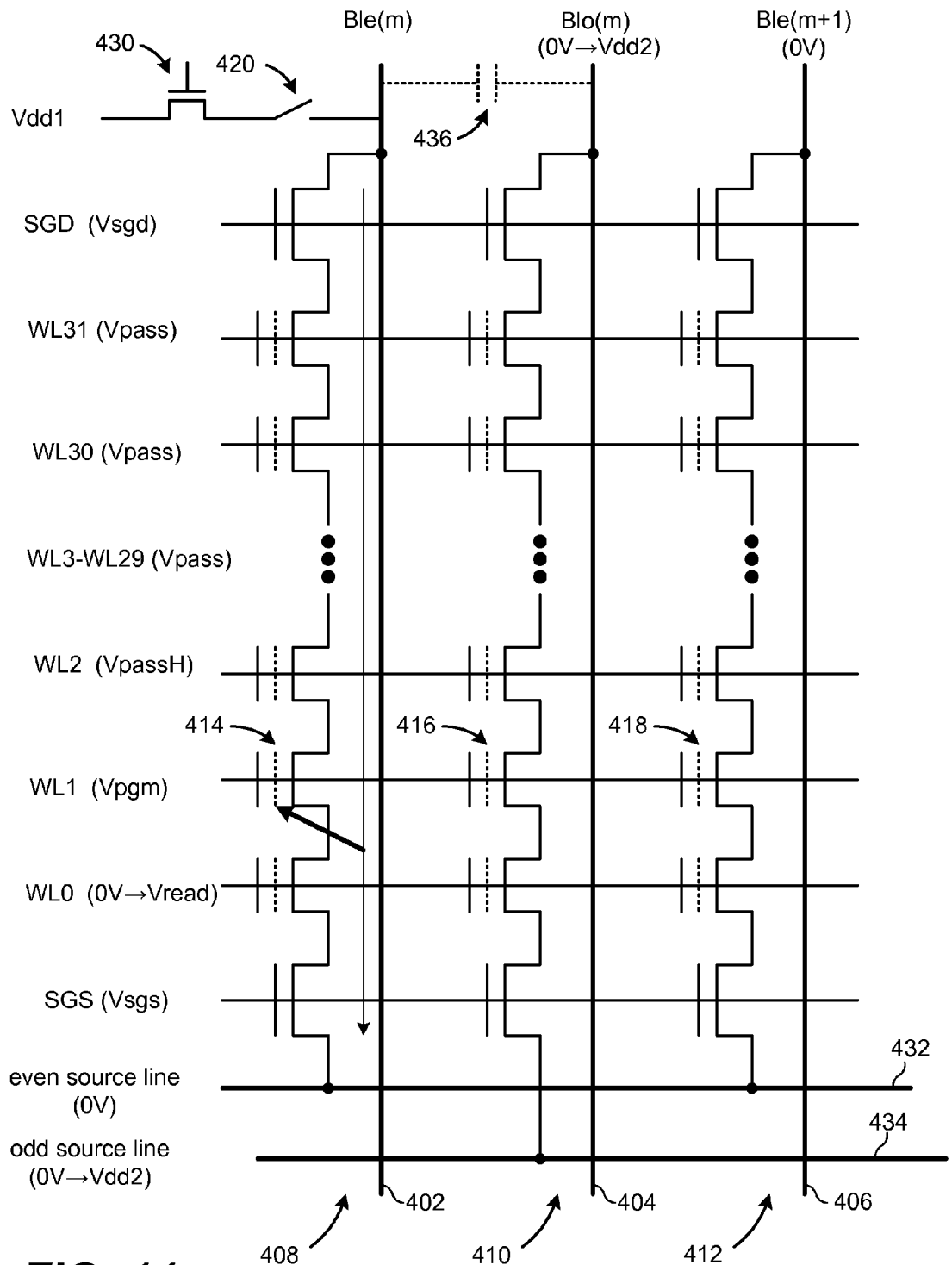
FIG. 11 is a circuit diagram of a portion of a memory array biased for source side injection programming using a boosted bit line voltage in accordance with one embodiment.

According to one embodiment of the present disclosure, a high voltage bit line for source side injection programming is provided in a manner that does not require selection circuitry that can withstand the high voltage levels of the bit line. This permits SSI programming to be implemented in systems that have selection circuitry designed to handle low voltage FN programming. FIG. 11 depicts a portion of a memory array biased for SSI programming in accordance with one embodiment. Capacitive coupling between neighboring bit lines is used to locally generate a high voltage for a selected bit line during source side injection programming. By using capacitive coupling to generate the high voltage level needed to promote programming for selected bit lines, the selection circuitry does not have to accommodate the high voltage. This may allow current low voltage column control circuitry to provide the high voltage bit line during source side injection programming.

The NAND array depicted in FIG. 11 includes NMOS transistor 430 for routing a low voltage Vdd1 to a selected bit line. NMOS transistor 430 allows the low voltage to be maintained on the bit line during a later boosting phase. Vdd1 is between 2V and 3V in one embodiment but can vary to achieve a desired level of overall boosting. In one embodiment, a multiplexer can be used to route a common voltage to multiple bit lines without going through the local sense amplifiers. This multiplexer may include a transistor 430 for each bit line.

The array in FIG. 11 includes two source lines per block. Rather than a single common source line for the block, there is provided an even source line that is associated with the even set of bit lines and an odd source line that is associated with the odd set of bit lines. It is noted that the terms odd and even are arbitrary and selected only for clarity in disclosure. NAND string 408 is connected to even bit line 402 and even source line 432, NAND string 410 is connected to odd bit line 404 and odd source line 434, and NAND string 412 is connected to even bit line 406 and the even source line 432. Each even bit line will connect to a NAND string also connected to the even source line and each odd bit line will connect to a NAND string also connected to the odd source line.

FIG. 11 depicts a capacitor 436 between bit lines 402 and 404. Capacitor 436 represents the natural capacitance that exists between the conductive materials (e.g., metal) that form bit lines 402 and 404. Capacitor 436 is not an additional structure added to the memory array but rather, a representation of the capacitance that naturally occurs between the closely spaced bit lines. A similar capacitance exists between bit lines 404 and 406, etc.

The bias conditions depicted in FIG. 11 promote SSI programming by generating a high bit line voltage through capacitive coupling with neighboring unselected bit lines. Memory cell 414 of word line WL1 is selected for programming in the described example and receives programming voltage Vpgm. Memory cell 414 is part of NAND string 408 which is connected to even source line 432 through source select gate 436. The even source line 432 remains at 0V throughout programming. The unselected even bit line 406 remains at 0V to inhibit programming of memory cell 418. The drain select gate 438 is opened by applying Vsgd on drain selection line SGD and the source select gate 436 opened by applying Vsgs on source selection line SGS. The unselected word lines WL3-WL31 receive pass voltage Vpass and unselected word line WL2 receives pass voltage VpassH. In other embodiments, the same pass voltage is used for all the unselected word lines. Furthermore, the bit line side word lines receive VpassH and the source side word lines receive VpassL in another embodiment. A low voltage Vdd1 is applied to selected bit line 402 at the beginning of programming. Switch 420 is closed to permit Vdd1 to be passed to bit line 402. The unselected odd bit lines including bit line 404 begin at 0V. Any unselected even bit lines such as bit line 406 remain at 0V throughout programming to inhibit programming.

Bit line 402 pre-charges to the low voltage level Vdd1. After pre-charging, the selected bit lines are boosted to a voltage higher than the pre-charge level. The odd bit lines are ramped from their starting level of 0V to another low voltage Vdd2. Vdd2 can vary by embodiment to achieve a desired level of overall boosting. In one embodiment, Vdd2 is between 2V and 3V. The even bit lines are capacitively coupled to their adjacent neighboring odd bit lines as illustrated by capacitor 436. Because of capacitive coupling between the neighboring bit lines, the even selected bit lines are boosted in accordance with the low voltage applied to the odd bit lines. NMOS transistor 430 permits the selected bit lines to be pre-charged to Vdd1 and then to rise in accordance with the voltage applied to the unselected odd bit lines. The capacitive coupling effect between the neighboring bit lines is used to generate a high voltage on the selected bit line. The resulting bit line voltage is approximately equal to the sum of the pre-charge voltage Vdd1 and some portion of Vdd2. The portion of Vdd2 that is coupled to the selected even bit lines is governed by the capacitive coupling ratio that exists between adjacent bit lines. Accordingly, the boosted voltage of the selected bit line can be represented by Vdd1+$\lambda$Vdd2. In this representation, $\lambda$ accounts for the coupling from both adjacent bit lines (i.e., BLom/BLom−1). The capacitive coupling ratio between bit lines will vary by implementation, dependent upon spacing, size, etc. In one exemplary embodiment, the ratio is about 80%.

The odd source line is raised from 0V to Vdd2 when raising the odd bit lines to Vdd2. The NAND strings connected to an odd bit line are not selected for programming. The memory cells at the selected word line in these NAND strings are to be inhibited from programming when the programming voltage is applied. The odd source line voltage rises with the odd bit line voltage to maintain no difference in potential across the corresponding NAND strings. No programming current is induced through the string and the unselected memory cells are inhibited from programming.

After boosting the voltage on the selected even bit lines, the even source lines are lowered from Vdd to 0V. A programming current is induced from drain to source in each selected NAND string. The source side adjacent word line WL0 is swept from 0V to Vread to turn on memory cell 424 and apply the appropriate voltage for exciting electrons. Memory cell 424 turns on when the word line voltage reaches its threshold voltage, based on its current level of programming. When memory cell 424 is placed into an on-state, it permits conduction from drain to source through NAND string 408. With each memory cell of the selected NAND string in an on-state, the high bit line voltage resulting from boosting is transferred into the NAND string channel. The high voltage is present at the source side of memory cell 414 and the drain side of memory cell 424. The large potential existing with Vpgm on WL1 excites hot electrons which are injected at the source side of the floating gate of memory cell 414. The particular voltage applied to word line WL0 that achieves excitation will vary and may be less than, equal to or greater than the cell's threshold voltage.

It is possible in other embodiment to utilize a different node for capacitively coupling a boosting voltage to the selected bit lines. For example, a voltage can be applied to the p-well in which the cells are formed in order to boost the bit line voltage. Additionally, word lines in unselected blocks or a dedicated booster plate capacitor could also be used. It is noted that the capacitively coupling ratios between these nodes and the selected bit lines will likely be different from the ratio between adjacent bit lines and should be considered when attempting to achieve a particular boosted bit line voltage.

Figure 12:
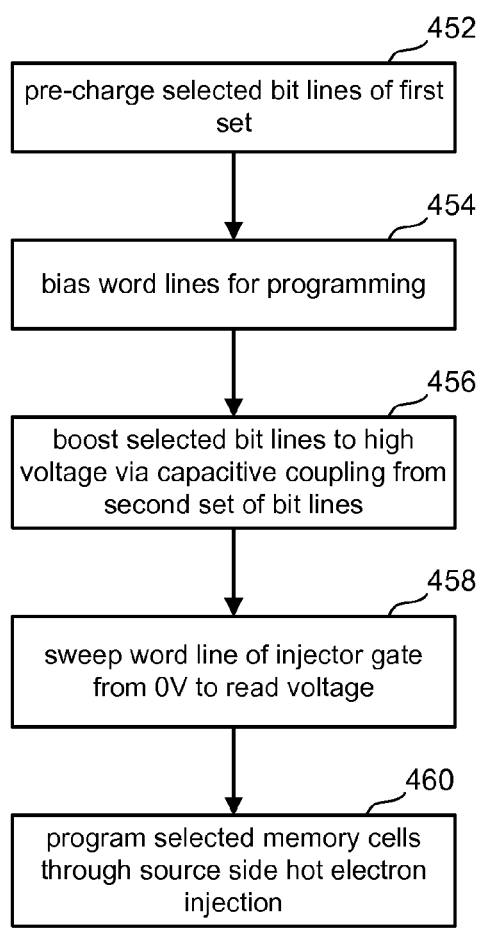
FIG. 12 is a flowchart of a method of programming non-volatile memory by source side injection in accordance with one embodiment.

FIG. 12 is a flow chart describing source side injection programming according to one embodiment of the present disclosure. The flow chart of FIG. 12 can be used with an architecture as depicted in FIG. 11 where two sets of bit lines and two source lines are included for a block of memory cells. The first set of bit lines connects to a first plurality of NAND strings that are connected to the first source line and the second set of bit lines connects to a second plurality of NAND strings that are connected to a second source line. Selected bit lines in the first set of bit lines are pre-charged to a predetermined level at step 452. The selected bit lines of the first set are those that are being programmed during the current programming iteration. A data latch for the corresponding bit line is set as previously described to indicate whether the corresponding cell of the bit line should be programmed. Step 452 may include pre-charging the odd selected bit lines or the even selected bit lines, for example.

At step 454, the word lines are biased for programming. Pass voltages can be applied to the unselected word lines and a program voltage applied to the selected word line. The word line neighboring the selected word line on its source side remains at 0V during step 454. The selected bit lines in the first set are boosted above the pre-charge voltage level at step 456. Capacitive coupling with the second set of bit lines is used to boost the voltage of the selected bit lines in the first set. Step 456 can include applying a positive voltage to the second set of bit lines and the second source line. At step 458, the word line connecting to the cells to serve as injector gates is swept from an initial starting voltage of 0V to read pass voltage Vread. At step 460, the selected memory cells are programmed through source side hot electron injection. A programming current flows from drain to source through the selected NAND strings under the applied bias. A high positive voltage is present at the source side of the selected memory cell and the drain side of the injector gate adjacent to the selected memory cell. Under application of a programming voltage to the selected word line, a high electric field is created at the source side of the selected cell, exciting hot electrons which are injected at the source side of the floating gate for the selected memory cell. In one embodiment, the method of FIG. 12 can be used at step 316 of FIG. 9, during each programming iteration.

Figure 13:
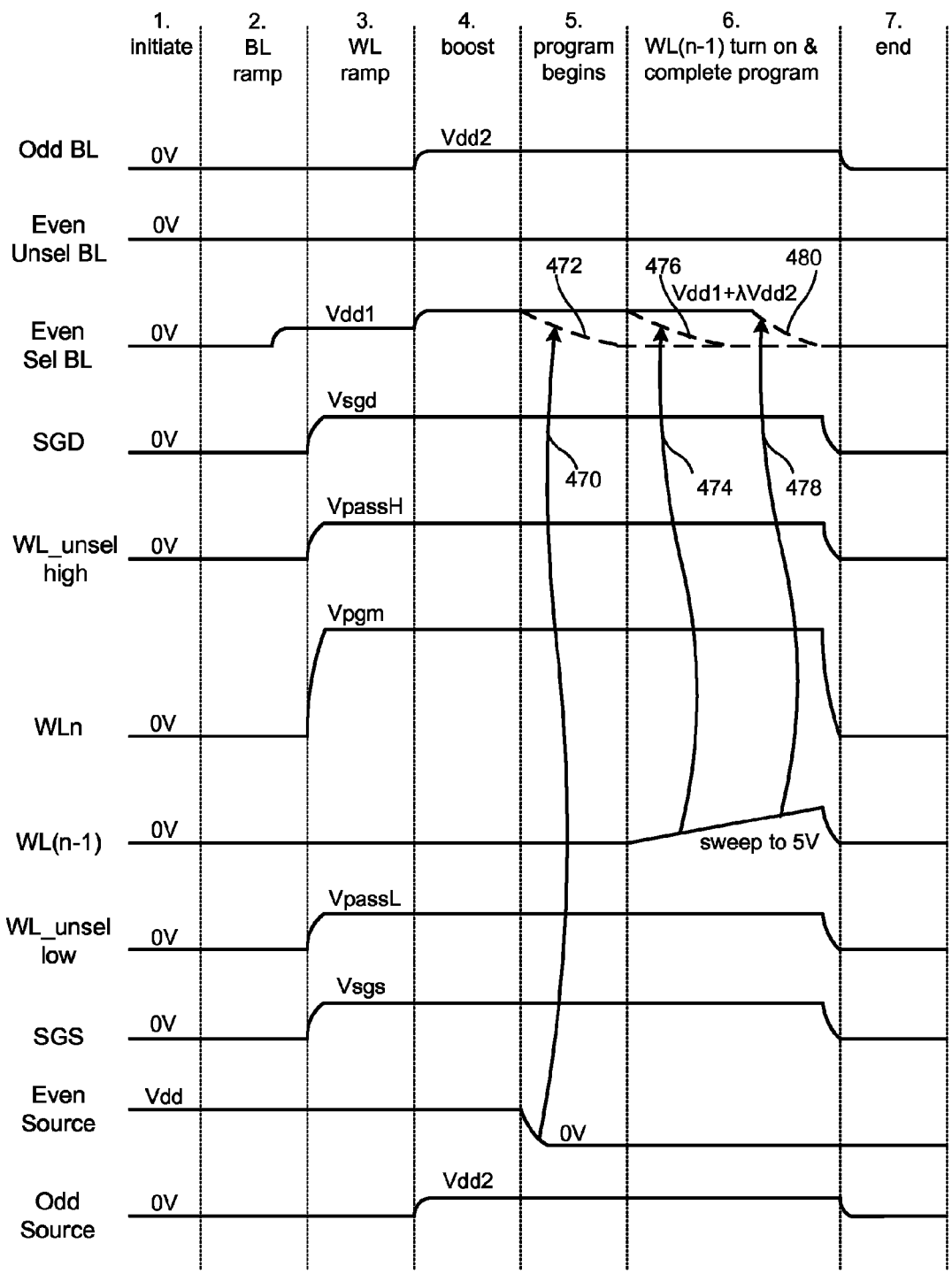
FIG. 13 is a timing diagram describing various signals that may be applied to a memory device during programming according to one embodiment using source side injection programming.

FIG. 13 is a timing diagram describing various voltage signals for a block of memory cells during source side injection programming according to one embodiment. Programming is initiated by raising the even source line to Vdd. The even selected bit lines are ramped to Vdd1. The unselected even bit lines remain at 0V. The odd bit lines remain at 0V. After pre-charging the selected even bit lines to Vdd1, the word lines are biased. In the described embodiment, the unselected word lines at the drain side of selected world line WLn, denoted WL_unsel_high, receive VpassH. Word line WLn−1 remains at 0V. The unselected word lines on the source side of selected word line WLn, denoted WL_unsel_low, receive VpassL. VpassH is greater than VpassL in one embodiment. VpassH can be equal to Vpgm in one embodiment and VpassL equal to Vread (e.g., 5V). A single Vpass equal to Vread is used for all unselected word lines in one embodiment. Selected word line WLn is raised to programming voltage Vpgm. The drain and source select gates are opened by applying Vsgd to drain selection line SGD and Vsgs to source selection line SGS.

After biasing the word lines and opening the select gates, the selected even bit lines are boosted above pre-charge level Vdd1. Vdd2 is applied to the odd bit lines. Based on the capacitive coupling ratio λ existing between bit lines, the even selected bit lines are boosted in accordance with the voltage Vdd2. The resulting voltage on the selected even bit lines is equal to the sum of the pre-charge level Vdd1 and λVdd2, where λ includes the coupling from both adjacent bit lines. Vdd2 is applied to the odd source line when applying Vdd2 to the odd bit lines to inhibit programming in these NAND strings.

The even source lines are lowered from Vdd to 0V to begin programming by SSI. The drain to source potential initially induces a programming current in those strings where the cell at word line WLn−1 is erased. Arrow 470 denotes a NAND string having a memory cell at word line WLn−1 in the erased state. When the even source line is initially lowered to 0V, a programming current is induced from the selected bit line to the even source line, discharging the bit line as indicated by line 472.

Word line WLn−1 is swept from 0V to Vread to enable programming in those NAND strings having a memory cell at word line N−1 in a programmed state. A programming current is induced in each NAND string when the voltage at WLn−1 reaches the corresponding memory cell's threshold voltage. Electron injection will occur when word line voltage reaches a particular level. In one embodiment a Vread type voltage can be applied without sweeping the voltage. However, the particular voltage that best achieves SSI may not be applied. Arrow 474 illustrates a NAND string having a memory cell at WLn−1 in an intermediate programmed state (e.g., state A or B). When the word line WLn−1 voltage reaches an intermediate level, e.g. 2V, the memory cell turns on, inducing a programming current. The bit line discharges as indicated by line 476. Arrow 478 illustrates a NAND string having a memory cell at word line WLn−1 in a higher programmed state (e.g., state C). Line 480 denotes the bit line discharge of these NAND strings. After sweeping word line WLn−1 to Vread, the drain and source selection lines are lowered to 0V. The word lines are also lowered to 0V. The odd bit lines and odd source lines are lowered to 0V, complete one programming iteration. In one embodiment, the timing diagram of FIG. 13 is used at step 316 of FIG. 9.

Figure 14:
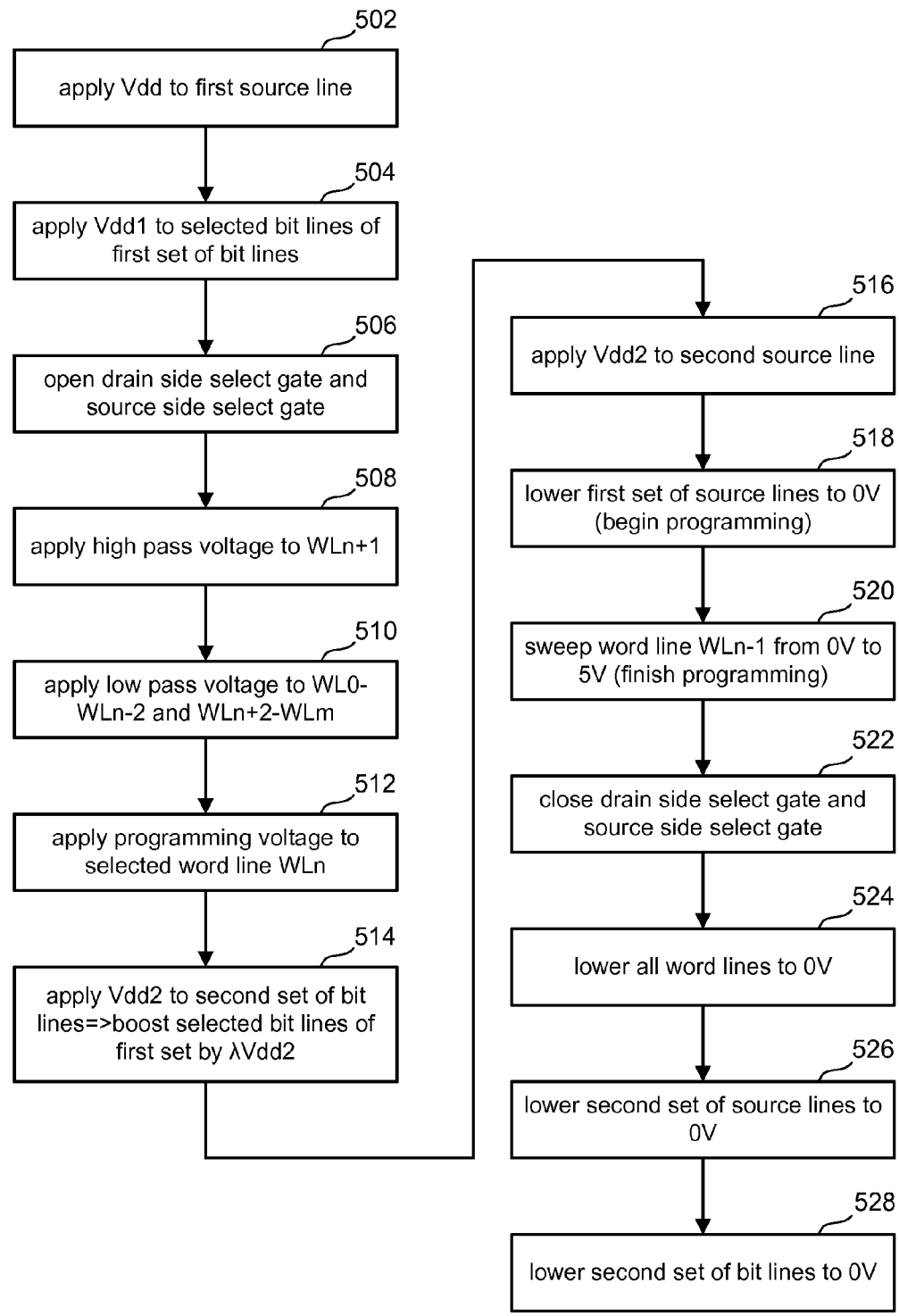
FIG. 14 is a flowchart of a method of programming non-volatile memory by source side injection in accordance with one embodiment.

FIG. 14 is a flow chart describing source side injection programming according to one embodiment of the present disclosure. FIG. 14 is performed for step 316 of FIG. 9 in one embodiment. At step 502, Vdd1 is applied to a first source line for a block of memory cells. The first source line may be an odd source line, even source line or a different type of source line depending upon the architecture used. Vdd1 is applied to selected bit lines in a first set of bit lines at step 504. The first set of bit lines corresponds to the first source line of step 502 and connects to the NAND strings also connected to the first source line. The first set of bit lines may be a even set of bit lines, odd set of bit lines or a different type of bit line depending upon the architecture used. The selected bit lines are those to be programmed during the current programming iteration, based upon their current state and the data to be stored therein, as indicated in a data latch for the bit line. At step 506 the drain and source select gates are turned on by applying Vsgs to the source selection line and Vsgd to the drain selection line. A pass voltage VpassH is applied to word line WLn+1 at step 508. At step 510, a pass voltage VpassL is applied to the remaining unselected word lines. In another embodiment, word lines WLn+1-WLm receive VpassH. A program voltage pulse is applied to the selected word line WLn at step 512.

Vdd2 is applied to a second set of bit lines at step 514 and the second source line for the block of memory cells at step 516. For example, if the first set of bit lines is an even set of bit lines, the second set of bit lines will be the odd set of bit lines. Applying Vdd2 to the second set of bit lines causes the selected bit lines in the first set to be boosted in relation to the magnitude of Vdd2 and the capacitive coupling ratio existing between bit lines. Vdd2 is applied to the second source line while applying Vdd2 to the second set of bit lines to inhibit programming of the memory cells in the NAND strings connected to the second set of bit lines. The first source line is lowered to 0V at step 518 to induce a current flow from drain to source through the selected NAND strings. Word line WLn−1 is swept from 0V to 5V at step 520 Programming occurs in those NAND strings when the cell at word line N−1 is in an on-state, permitting the programming current to flow and a particular control gate voltage is applied. The drain select gates and source select gates are closed at step 522. The word lines are lowered to 0V at step 524. The second source line is lowered to 0V at step 526. The second set of bit lines is lowered to 0V at step 528.

Figure 15:
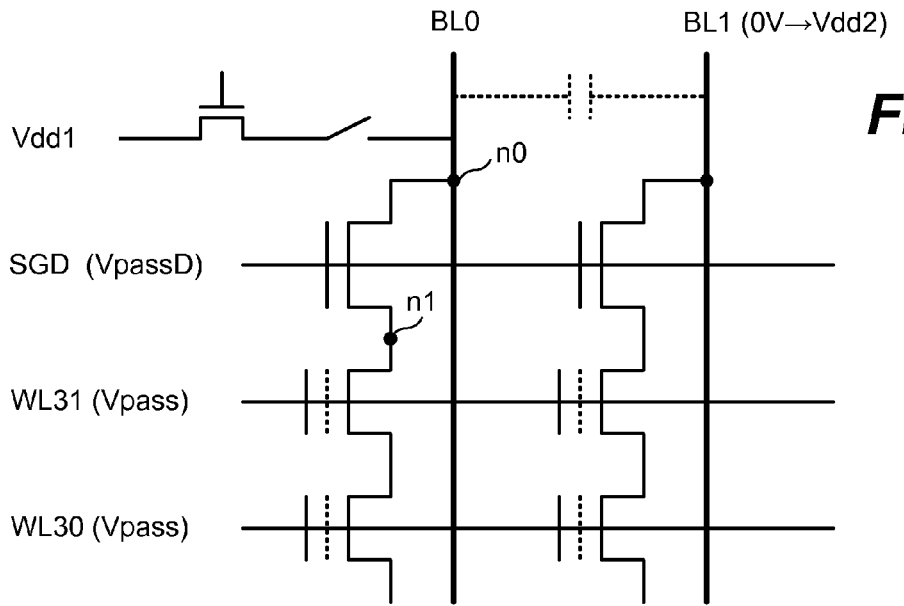
FIG. 15 is a circuit diagram of a portion of a memory array biased for source side injection programming using a boosted bit line voltage according to one embodiment.

FIG. 15 depicts a portion of the memory array shown in FIG. 11. The bias conditions at the drain select gate and bit line are emphasized. The drain select gate receives Vsgd. The bit line is pre-charged to Vdd1 and is then boosted according to Vdd2. The bit line voltage at node n0 V(n0) is equal to Vdd1+λVdd2. Vsgd is a large positive voltage (labeled VpassD) in one embodiment to transfer the full bit line voltage through the select gate and into the NAND string at node n1. The drain select gate remains out of saturation so long as VpassD−Vt>V(n0). If this condition is met, the NAND string channel voltage at node n1, V(n1), is equal to V(n0). In one embodiment, VpassD is about 8V, but can vary by the requirements of a given implementation.

A large select gate bias allows individual bit line voltages to be applied to the selected bit lines to influence the amount of programming that occurs for the corresponding memory cell. Individual values at Vdd1 can be routed to the bit lines based on the amount of desired programming for a corresponding memory cell during the current programming iteration.

The boosted voltage from programming that is dependent upon the capacitive coupling ratio between bit lines. Thus, the actual boosted voltage of a selected bit line may vary within an array because of differences in the spacing, etc. of various components of the array such as the bit lines. For instance, the capacitive coupling ratio will be larger for bit lines that are more closely spaced than bit lines that are more largely spaced. Such variances can be expected in normal manufacturing tolerances. A regulated channel voltage as depicted in FIG. 16 may be useful to overcome such variances so as to provide a more consistent programming rate.

Figure 16:
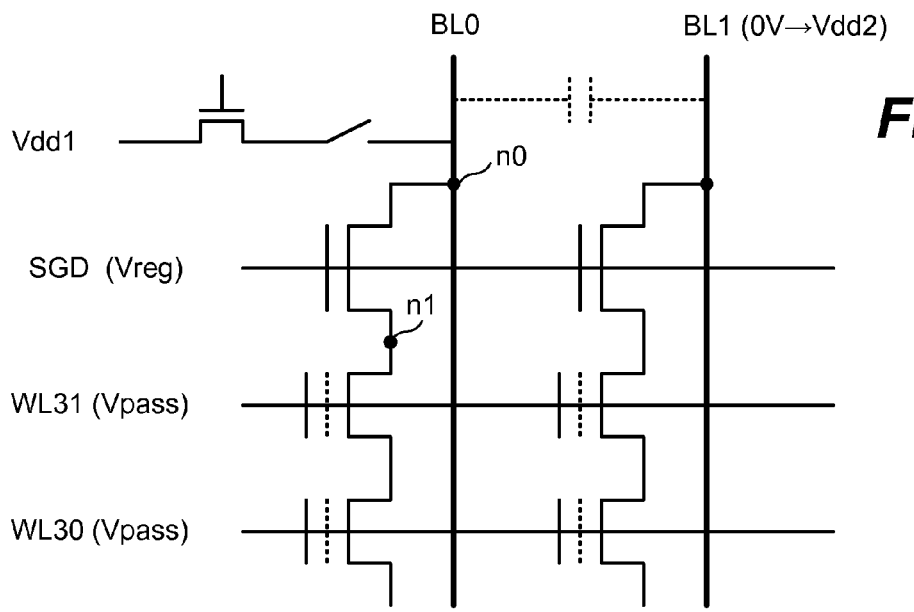
FIG. 16 is a circuit diagram of a portion of a memory array biased for source side injection programming using a boosted bit line voltage and regulated channel voltage according to one embodiment.

FIG. 16 depicts a portion of the memory array in FIG. 11 biased according to another embodiment of the present disclosure. The bias conditions in FIG. 16 allow the NAND string channel voltage to be regulated by Vsgd and therefore, not dependent on the capacitive coupling ratio between bit lines. A lower magnitude voltage Vreg is used for Vsgd. Vreg is applied to the drain select gate line SGD to provide a more controlled channel voltage for programming. It was described earlier that the bit line voltage V(n0) is fully transferred to the NAND string channel when Vsgd−Vt>V(n0). If the drain select gate is placed into saturation, however, the voltage transferred into the channel will be regulated according to the magnitude of Vsgd. So long as the bit line voltage is greater than Vsgd−Vt, the drain select gate remains in saturation. When this condition is met, the channel voltage in the NAND string V(n1) will be equal to Vsgd−Vt. Thus, it is possible to regulate the channel voltage to the level of about Vsgd−Vt. The drain select gate can be placed into saturation so that the channel voltage at node n1 will be equal to the difference between the applied select gate line voltage Vsgd and the threshold voltage of the select gate transistor.

Figure 17:
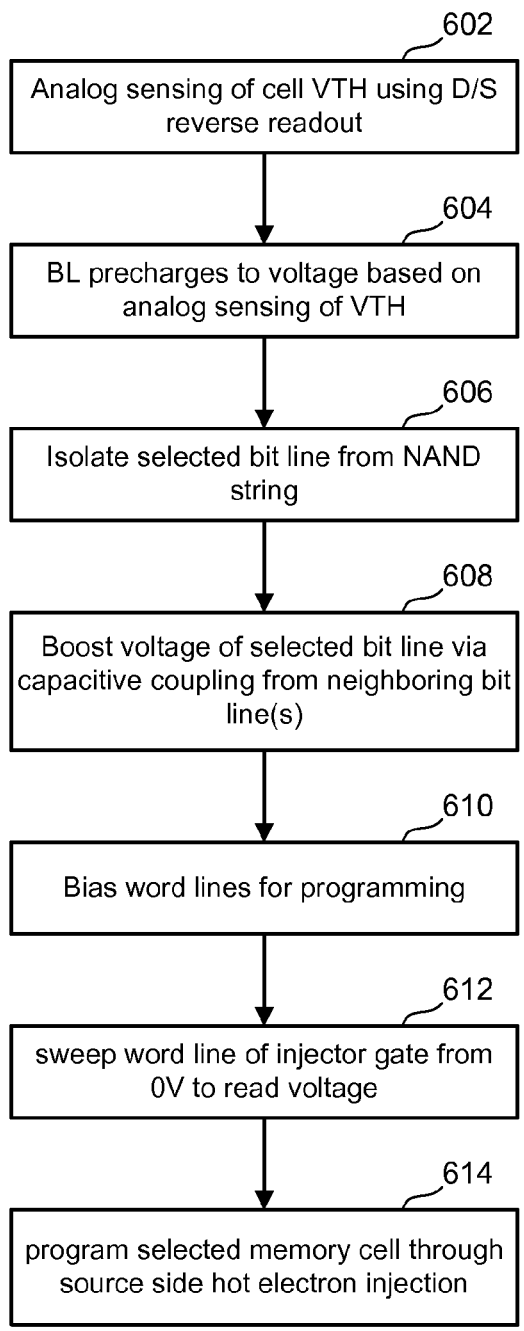
FIG. 17 is a flowchart of a method of programming non-volatile memory by source side injection programming using a self-adjusting bit line voltage in accordance with one embodiment.

FIG. 17 is a flow chart describing source side injection programming according to another embodiment of the present disclosure. In FIG. 17, analog sensing of the threshold voltage of the memory cells along the selected word line is performed as part of each programming iteration. The pre-charge level of an individual bit line is self-adjusted based on sensing the analog threshold voltage of the selected memory cell being programmed. The level of pre-charge on the individual bit line will correspond to the current threshold voltage of the selected memory cell. The programming speed of the selected memory cell is automatically adjusted by the level of pre-charge.

FIG. 17 describes the programming operation with respect to a single memory cell, however it will be appreciated that in typical implementations operation of the flow chart will be performed in parallel for a number of memory cells. FIG. 17 can be used at step 315 of FIG. 9 in one embodiment. At step 602, the threshold voltage of a selected memory cell is sensed using a drain to source reverse readout to obtain an analog representation of the threshold voltage. At step 604, the bit line corresponding to the selected memory cell pre-charges to a voltage level based upon analog sensing of the selected memory cell's threshold voltage at step 602.

The selected bit line is isolated from its corresponding NAND string at step 606. Step 606 can include lowering the voltage on selection line SGS to 0V to cut off the drain select gate. At step 608, the selected bit line voltage is boosted via capacitive coupling from the neighboring bit lines. Step 608 can include applying a positive voltage such as Vdd2 on the odd bit lines. Vdd2 is also applied on the odd source line so as not to induce programming in the odd NAND strings. With a positive voltage on the odd bit line, the voltage level of the even selected bit line is boosted by capacitive coupling between the two bit lines. At step 610, the word lines are biased for programming. Step 610 can include applying a pass voltage to each of the unselected word lines and the program voltage Vpgm to the selected word line. The word line adjacent to the selected word line on its source side remains at 0V. In one embodiment, the drain side word lines are raised to a higher pass voltage VpassH than the source side unselected word lines which are raised to VpassL. At step 612, word line WLn−1, which connects to the injector gates, is swept from 0V to the read pass voltage level Vread. This enables programming in those NAND strings having a memory cell at word line WLn−1 in one of the programmed states. At step 614, the selected memory cell is programmed at its source side by hot electron injection with the adjacent memory cell WLn−1 serving as the injector gate.

If memory cells along the selected word line are being programmed to different target states, steps 602 through 606 may be repeated for each of the target states. If four state devices are used, analog sensing at the target threshold voltage for state A can be performed and the bit lines pre-charged. A sample and hold capacitor can be used to store the pre-charge level. Those bit lines having a memory cell to be programmed to state A can then close the sample and hold capacitor. The bit lines having a cell to be programmed to state B can discharge their sample and hold capacitor. The state B verify level can then be applied for analog sensing and the process repeated. Finally, the state C verify level can be applied and the process again repeated. Different orders for sensing can be performed as well. For example, the verify levels could be applied from the highest level to the lowest level instead. In such an embodiment, it may be useful to close the sample and hold capacitor for a bit line during application of the verify levels not corresponding to the target state of the corresponding memory cell.

In another embodiment, programming according to the process of FIG. 17 can first performed using Vgoal=VvA until all cells to be programmed to states A, B and C verify at the state A level. The bit lines having a memory cell to be programmed to state A can be locked out from further programming by setting the appropriate value in their corresponding data latches. Programming according to the process of FIG. 17 can then be performed using Vgoal=VvB until all cells to be programmed to states B and C verify level verify at the state B level. The bit lines having a memory cell to be programmed to state B can be locked out and the process repeated for the cells to be programmed to state C using Vgoal=VvC.

Figure 18:
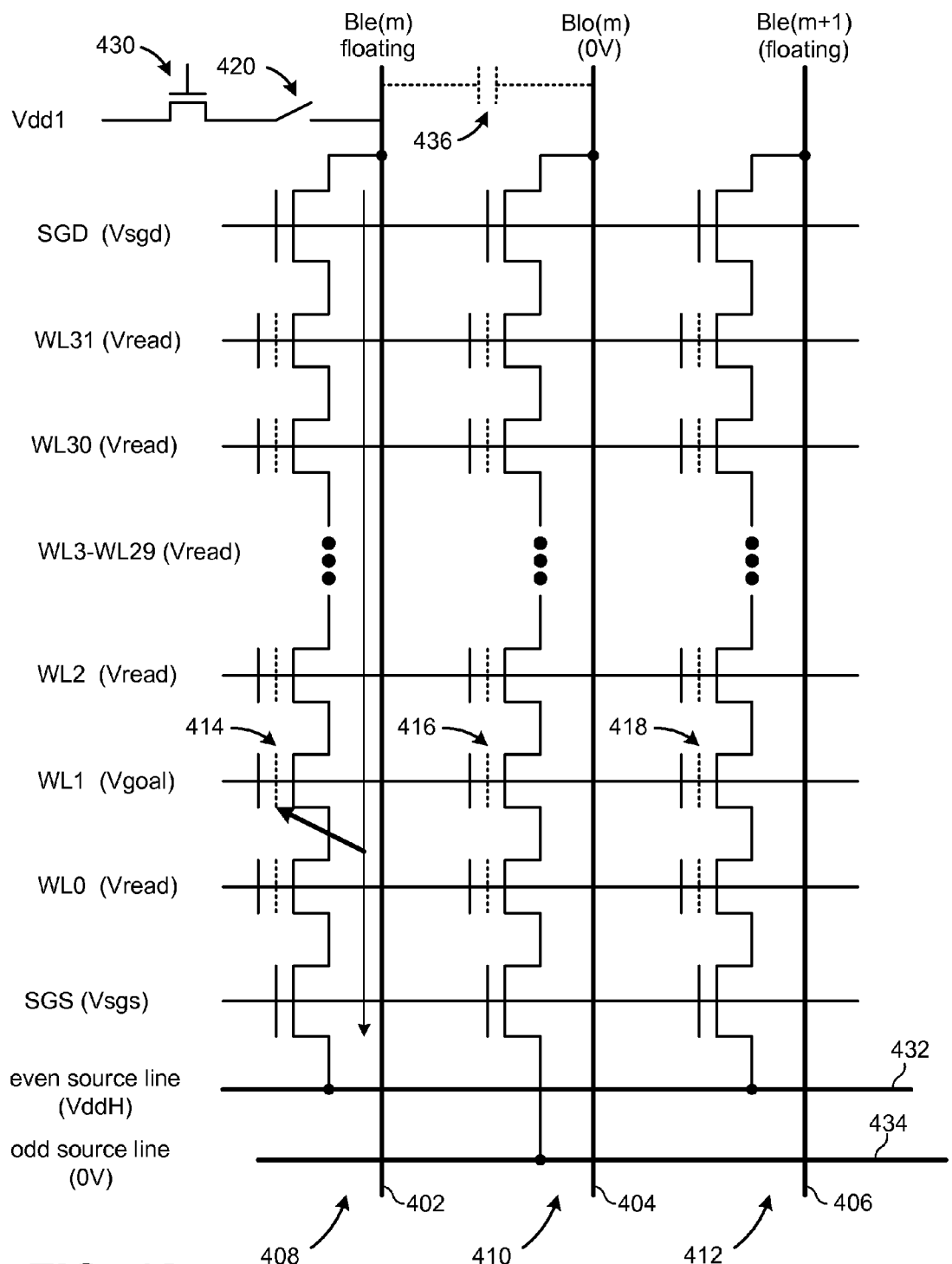
FIG. 18 is a circuit diagram of a portion of a memory array biased for pre-charging a selected bit line based on analog sensing of the actual threshold voltage of a selected storage element during the pre-charge.

FIG. 18 depicts a portion of a memory array and bias conditions that can be used for sensing an analog voltage of a selected memory cell using a drain to source reverse readout. These bias conditions facilitate charging the bit line based on the programmed level of the selected memory cell. In one embodiment, steps 602 and 604 of FIG. 17 can be performed under the bias conditions of FIG. 18.

The even unselected bit lines and the odd bit lines are held at 0V. The selected even bit lines are allowed to float during the analog sensing and precharge phases. This enables the selected even bit lines to pre-charge in accordance with the current threshold voltage of the selected memory cell. The drain select gate is opened by applying read pass voltage Vread on selection line SGD. The source select gate is opened by applying Vsgs on selection line SGS. The unselected word lines are raised to the read voltage Vread. The even source line is raised to Vdd.

A target threshold voltage level Vgoal for the selected memory cell at bit line 402 is applied to the selected word line WLn. The selected even bit line will precharge to the lesser of: 1) the voltage difference between the target threshold voltage Vgoal and the cell's actual Vt; or 2) the full voltage Vdd1 placed on even source line 432. Sensing at step 602 of FIG. 17 is described as a reverse drain source readout. As illustrated in FIG. 18, the bit line is allowed to float while a positive voltage is applied on the source line. Under the applied bias conditions with a positive bias from source line to bit line through the NAND string, the drain and source regions of the memory cells in the NAND string are reversed. For example, the side of memory cell 414 closest to the source line serves as the drain while the side closest to the bit line serves as the source during the reverse readout operation.

When the difference between the target threshold voltage Vgoal and the actual threshold voltage Vt of memory cell 414 is greater than Vdd1, memory cell 414 remains out of saturation and passes the full source line potential to bit line 402. The selected bit line will pre-charge to the source line potential Vdd1. If the difference between the target threshold voltage and the actual threshold voltage of the memory cell on word line WLN is less than Vdd1, memory cell 414 will only pass that amount of the source line potential that is equal to the difference between the target threshold voltage Vgoal and the actual threshold voltage Vt.

As the difference between the target threshold voltage and actual threshold voltage decreases, the amount by which the bit line will precharge decreases. In this manner, the further a cell is form the target threshold voltage, the more the bit line will be pre-charge and the faster the cell will program during the current iteration. As the actual threshold voltage approaches the target threshold voltage, the bit line will charge to a lesser extent based on the difference between the target and current threshold voltage. The programming speed will be slowed as the memory cell approaches the target threshold voltage level facilitating more accurate placement of the threshold voltage near the target level.

Figure 19:
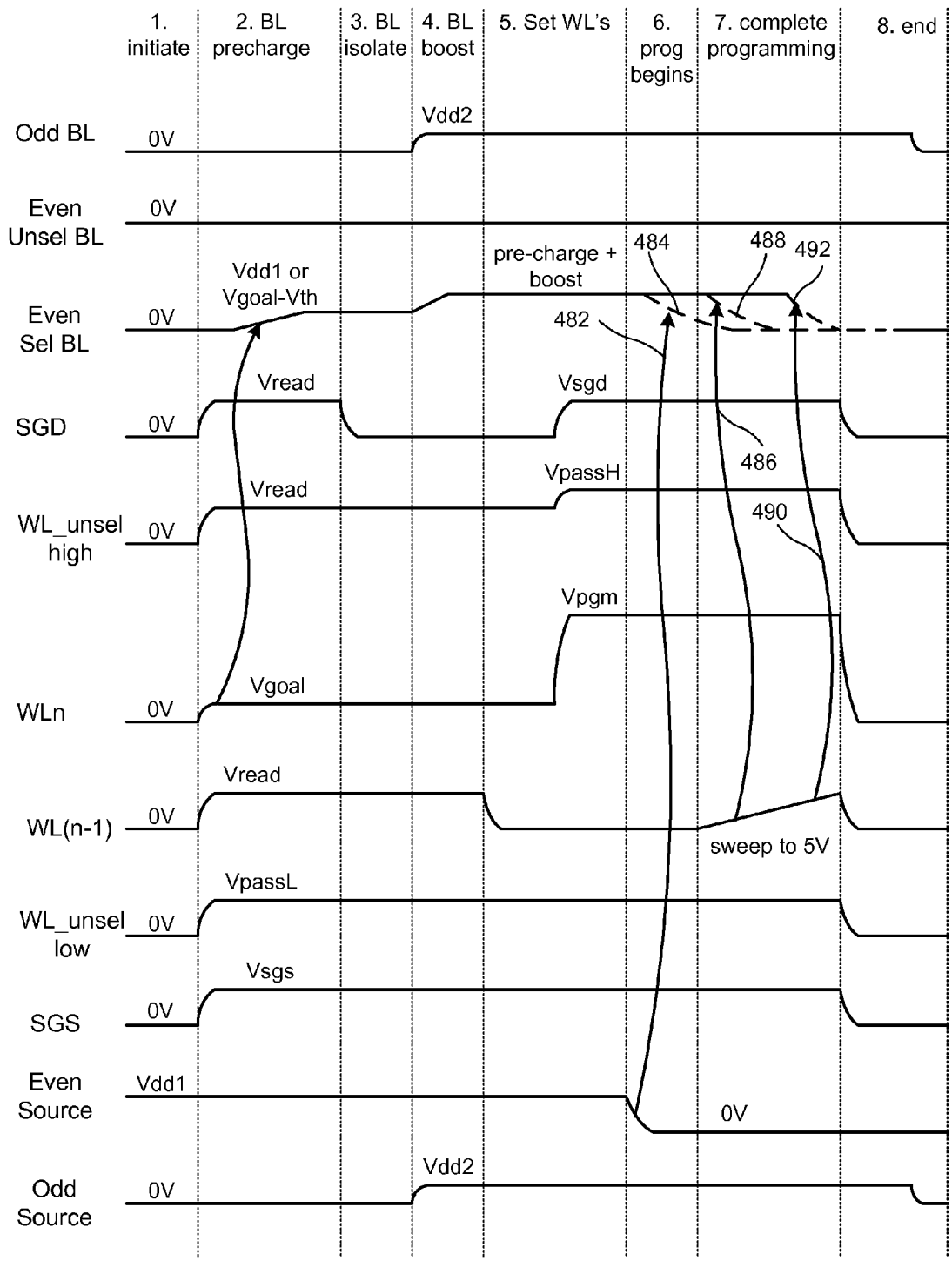
FIG. 19 is a timing diagram describing various signals that may be applied to a memory device during programming according to one embodiment using source side injection programming with a self-adjusting bit line pre-charge voltage.

FIG. 19 is a timing diagram describing source side injection programming according to one embodiment, including analog sensing for a controlled bit line pre-charge. Programming is initiated by raising the even source line to Vdd. Analog sensing and pre-charge the bit line is initiated by raising each unselected word line to the voltage Vread. The selected word line WLn is raised to the target threshold voltage. The drain select gate is opened by applying the read voltage Vread on the drain selection line SGD. The source select gate is opened by applying Vsgs on selection line SGS. The odd bit lines and the unselected bit lines of the first set remain at 0V. At the beginning of the bit line pre-charge phase, the even selected bit lines are allowed to float so they can precharge in accordance with the actual threshold voltage of the memory cell at word line WLn. Under the applied bias conditions, a potential is created from source line to bit line through the selected NAND string. The selected bit line will precharge to the lesser of the source line voltage Vdd1 or difference between the target threshold voltage Vgoal and the memory cell's current threshold voltage Vt. If the difference between the target voltage and actual voltage is greater than Vdd, the bit line pre-charges to Vdd. If the difference in Vgoal and Vt is less than the source line potential Vdd1, the selected memory cell at word line WLn only transfers that amount of the source line potential that is equal to the difference between Vgoal and Vt.

After allowing the even selected bit lines to precharge in accordance with the threshold voltage of the corresponding selected memory cell, the bit lines are isolated from their corresponding NAND strings. Selection line SGD is lowered to 0V to turn off the drain select gate. After lowering selection line SGD to isolate the bit lines, the selected even bit lines are boosted above the pre-charge level. Vdd2 is applied to the odd bit lines and the odd source line. The even selected bit lines will be boosted in accordance with the magnitude of Vdd2 and the capacitive coupling ratio between neighboring bit lines. Although the amount of boosting is the same for each bit line, the pre-charge levels are individually established based on the corresponding cell's actual threshold voltage.

After boosting the bit lines, the word lines are set for the programming phase. The word line WLn−1 adjacent to the selected word line at its source side is lowered from the Vread to 0V. A pass voltage is applied to each remaining unselected word line. In one embodiment, a higher pass voltage VpassH is applied to the drain side neighboring word line. The programming voltage Vpgm is applied to the selected word line. After applying the word line voltages, the even source line is lowered from Vdd to 0V, creating a potential between drain and source through the selected NAND strings. Programming initially occurs in those NAND strings having a memory cell at word line WLn−1 in the erased state. Arrow 650 represents a NAND string having a memory cell at word line WLn−1 that is in the erased state. A programming current is induced in these NAND strings and their corresponding bit lines discharge as indicated by line 652.

Word line WLn−1 is then swept from 0V to read pass voltage Vread to promote programming in the remaining NAND strings that have a programmed memory cell at word line WLn−1. As the voltage on word line WLn−1 is raised, programming will occur in the various NAND strings based on the state of the cell at WLn−1. Arrow 654 represents a NAND string having a memory cell at word line WLn−1 in an intermediate programmed state. A programming current is induced in these NAND strings as WLn−1 reaches an intermediate voltage level. The bit lines of these NAND strings will discharge as indicated by line 656. Arrow 658 represents a NAND string having a memory cell at WLn−1 in the highest programmed state. The programming current is induced in these NAND strings when WLn−1 reaches a high voltage level to turn on the memory cells. The bit lines of these NAND strings will discharge as indicated by line 670. After completing programming, the word line voltages are lowered to 0V, the odd bit lines are lowered to 0V, and the odd source line is lowered to 0V.

Figure 20:
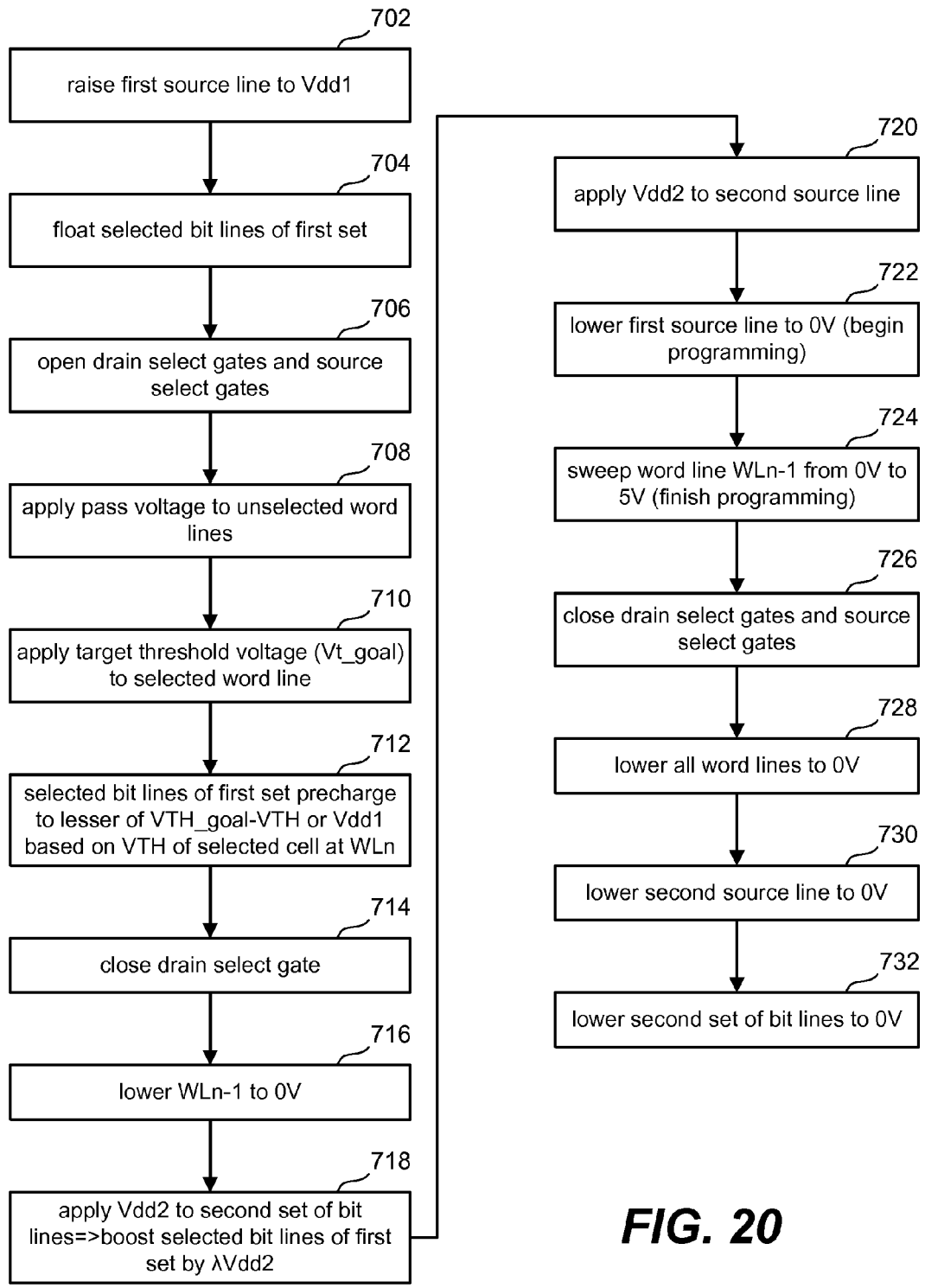
FIG. 20 is a flowchart of a method of programming non-volatile memory by source side injection programming using a self-adjusting bit line voltage in accordance with one embodiment.

FIG. 20 is a flow chart describing source side injection programming according to one embodiment of the present disclosure. Vdd1 is applied to a first source line for a block of memory cells at step 702. The selected bit lines of a first set of bit lines floated at step 704. The first set of bit lines corresponds to the first source line of step 702. For instance, if the first set of bit lines is an even set of bit lines, the source line of step 702 will be an even source line. The drain and source select gates are opened at step 706, and a pass voltage is applied to the unselected word lines at step 708. The target threshold voltage for a selected memory cell is applied to the selected word line WLn at step 710. At step 712, the selected bit lines in the first set are pre-charged to the lesser of Vgoal−Vt or Vdd1 based on the current threshold voltage of the selected memory cell at word line WLn. After pre-charging, the drain select gates are closed, isolating the bit lines from their corresponding NAND string.

Word line WLn−1 is lowered to 0V at step 716. Vdd2 is applied to the second set of bit lines at step 718 to boost the selected bit lines of the first set above the pre-charge level. The selected bit lines are boosted above the pre-charge level by λVdd2. At step 720, Vdd2 is applied to the second source line. Steps 718 and 720 are performed together in order to inhibit programming in the NAND strings connected to the second source line. The first source line is lowered to 0V at step 722. Source side injection programming is first initiated in those NAND strings having a memory cell at word line WLn−1 in the erased state. Word line WLn−1 is swept from 0V to 5V to finish programming in each remaining NAND string at step 724. After completing the source side injection process, the drain select gates and source select gates are closed at step 726. All of the word lines are lowered to 0V at step 728 and the second source line is lowered to 0V at step 730. The second set of bit lines is lowered to 0V at step 732.

The foregoing detailed description has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A non-volatile memory system, comprising:
   a first bit line;
   a second bit line adjacent to the first bit line;
   a selected non-volatile storage element in communication with the first bit line, the selected non-volatile storage element including a charge storage region; and
   managing circuitry in communication with the first bit line, the second bit line, and the selected non-volatile storage element that programs the selected storage element by providing a first voltage to the first bit line, providing a second voltage to the second bit line after providing the first voltage to the first bit line to boost the first bit line above a level of the first voltage, providing a third voltage to the gate region of the selected storage element, and injecting electrons from a source side of the selected storage element into the charge storage region of the storage element.

2. The non-volatile memory system of claim 1, further comprising:
   an unselected non-volatile storage element adjacent to the selected non-volatile storage element, the unselected storage element is in communication with the first bit line;
   wherein the managing circuitry provides a fourth voltage to a gate region of the unselected storage element while providing the first voltage, the second voltage, and the third voltage.

3. The non-volatile memory system of claim 2, wherein:
   providing the fourth voltage induces hot carrier injection of the electrons from the source side of the selected storage element into the charge storage region.

4. The non-volatile memory system of claim 3, wherein:
   providing the fourth voltage induces hot carrier injection of the electrons from a drain side of the unselected storage element into the charge storage region of the selected storage element; and
   the drain side of the unselected storage element and the source side of the selected storage element are a common electrical node.

5. The non-volatile memory system of claim 2, wherein:
   the unselected non-volatile storage element is a hot carrier injector providing the electrons from a drain side of the unselected storage element to the source side of the selected storage element.

6. The non-volatile memory system of claim 2, wherein the first bit line is in communication with a first NAND string, the first NAND string includes the selected storage element and the unselected storage element.

7. The non-volatile memory system of claim 2, wherein the selected storage element and the unselected storage element are multi-state flash memory cells.

8. The non-volatile memory system of claim 1, wherein the managing circuitry includes a state machine.

9. The non-volatile memory system of claim 8, wherein the managing circuitry further includes row control circuitry and column control circuitry.

10. A non-volatile memory system, comprising:
a first bit line;
a first word line;
a selected non-volatile storage element in communication with the first bit line and the first word line, the selected storage element including a charge storage region; and
managing circuitry that boosts the first bit line above an applied voltage level by coupling to the first bit line a portion of a second voltage applied to a different electrical node of the memory system, the managing circuitry applies a program voltage to the selected word line during at least a portion of the boosting and programs the selected storage element by injecting electrons from a source side of the selected non-volatile storage element into the charge storage region.

11. The non-volatile memory system of claim 10, wherein the different electrical node is an unselected bit line adjacent to the first bit line.

12. The non-volatile memory system of claim 10, wherein the different electrical node is a well region associated with a group of storage elements including the selected storage element.

13. The non-volatile memory system of claim 10, further comprising:
a second word line adjacent to the first word line in a source direction;
an unselected non-volatile storage element in communication with the second word line;
wherein injecting electrons from the source side of the selected non-volatile storage element includes injecting electrons from a drain side of the unselected storage element.

14. The non-volatile memory system of claim 10, wherein the managing circuitry applies a positive voltage to the second word line while applying the program voltage to the first word line.

15. The non-volatile memory system of claim 10, wherein the managing circuitry increases the positive voltage applied to the second word line while applying the program voltage to the first word line.

16. The non-volatile memory system of claim 15, wherein the managing circuitry increases the positive voltage by sweeping the second word line from a ground potential to a read voltage, the read voltage is a voltage sufficient to turn on a non-volatile storage element programmed to a highest level state associated with the non-volatile memory system.

17. The non-volatile memory system of claim 10, wherein:
the managing circuitry discharges the first bit line prior to applying the positive voltage to the second word line when the unselected non-volatile storage element is in an erased state; and
the managing circuitry discharges the first bit line as a result of increasing the positive voltage when the unselected non-volatile storage element is in a programmed state.

18. A non-volatile memory system, comprising:
a first word line;
a first set of bit lines;
a second set of bit lines, each bit line of the first set is adjacent to one or more bit lines of the second set;
a plurality of non-volatile storage elements in communication with the first word line, each non-volatile storage element of the plurality is in communication with one bit line from the first set of bit lines; and
managing circuitry in communication with the first word line, the first set of bit lines, and the second set of bit lines, the managing circuitry charges the first set of bit lines, boosts the first set of bit lines above a voltage level resulting from the charging by applying a first voltage to the second set of bit lines, applies a programming voltage to the selected word line while boosting the first set of bit lines, and programs one or more of the non-volatile storage elements as a result of boosting the first set of bit lines and applying the programming voltage to the selected word line.

19. The non-volatile memory system of claim 18, further comprising:
a first source line associated with the first set of bit lines;
wherein the managing circuitry applies a second voltage to the first source line and then lowers a magnitude of the second voltage while boosting the first set of bit lines to enable programming of the one or more non-volatile storage elements.

20. The non-volatile memory system of claim 19, further comprising:
a second source associated with the second set of bit lines;
wherein the managing circuitry applies a third voltage to the second source line while applying the first voltage to the second set of bit lines to inhibit programming of non-volatile storage elements in communication with the first word line and the second set of bit lines, the third voltage is equal to the first voltage.

21. The non-volatile memory system of claim 18, further comprising:
a second word line adjacent to the first word line in a source direction;
wherein the managing circuitry applies a second voltage to the second word line.

22. The non-volatile memory system of claim 21, wherein the managing circuitry increases a magnitude of the second voltage from a first level to a second level by sweeping the second voltage from the first level to the second level.

23. The non-volatile memory system of claim 22, wherein:
the one or more non-volatile storage elements includes a first non-volatile storage element, the first non-volatile storage element is in communication with a first bit line of the first set of bit lines;
the one or more non-volatile storage elements includes a second non-volatile storage element, the second non-volatile storage element is in communication with a second bit line of the first set of bit lines;
the managing circuitry programs the first storage element prior to increasing the magnitude of the second voltage, the managing circuitry discharges the first bit line when programming the first storage element; and
the managing circuitry programs the second storage element after a magnitude of the second voltage is increased from an initial magnitude, the managing circuitry discharges the second bit line when programming the second storage element.

24. The non-volatile memory system of claim 18, wherein:
the managing circuitry provides an inhibit voltage to a third set of bit lines while boosting the first set of bit lines and applying the programming voltage, wherein each bit line of the third set is adjacent to one or more bit lines of the second set.

25. The non-volatile memory system of claim 24, wherein:
the first set of bit lines and the third set of bit lines comprise a set of even bit lines; and
the second set of bit lines comprises a set of odd bit lines.

26. A non-volatile memory system, comprising:
a bit line;
a group of non-volatile storage elements in communication with the bit line; and
managing circuitry in communication with the group of non-volatile storage elements and the bit line, the managing circuitry programs a selected storage element of the group by pre-charging the bit line based on a current threshold voltage of the selected storage element, boosting the bit line above a voltage level resulting from the pre-charging, and programming the selected non-volatile storage element by discharging the bit line through the group of storage elements while applying a programming voltage to the selected storage element.

27. The non-volatile memory system of claim 26, wherein the managing circuitry programs the selected storage element by injecting electrons at a source side of a floating gate of the selected storage element.

28. The non-volatile memory system of claim 26, further comprising:
a source line associated with the group of storage elements;
wherein the managing circuitry pre-charges the bit line by applying a pre-charge voltage to the source line, applying a target threshold voltage to the selected storage element, charging the bit line to the pre-charge voltage level when a difference between the target threshold voltage and the current threshold voltage is larger than the pre-charge voltage, and charging the bit line to a level of the difference between the target threshold voltage and the current threshold voltage when the level of the difference is less than the pre-charge voltage level.

29. The non-volatile memory system of claim 28, wherein the managing circuitry applies the pre-charge voltage and the target threshold voltage as part of an analog sensing of the current threshold voltage of the selected storage element by drain source reverse readout.

30. The non-volatile memory system of claim 26, wherein:
the group of non-volatile storage elements is a NAND string;
the NAND string is part of a memory array including a plurality of NAND strings;
a plurality of word lines connect to the memory array;
the bit line is part of a first subset of bit lines connecting to a first subset of NAND strings of the plurality;
a second subset of bit lines is interleaved with the first subset and includes a second subset of NAND strings of the plurality; and
a first source line connects to the first subset of NAND strings and a second source line connects to the second subset of NAND strings.

31. The non-volatile memory system of claim 30, wherein the managing circuitry boosts the bit line by applying a boosting voltage to the second subset of bit lines.

32. The non-volatile memory system of claim 31, wherein the managing circuitry applies the boosting voltage to the second source line to inhibit programming in the second subset of NAND strings.

33. The non-volatile memory system of claim 32, wherein the managing circuitry boosts the bit line by raising the bit line from the pre-charge level to a boosted potential through capacitive coupling with at least one bit line of the second subset of bit lines.

34. A non-volatile memory system, comprising:
a group of non-volatile storage elements;
a source line associated with the group of storage elements;
a bit line associated with the group of storage elements; and
managing circuitry in communication with the group, the source line, and the bit line, the managing circuitry programs a selected storage element of the group by source side injection, the managing circuitry applies a first voltage to the source line, applies a target voltage to a selected storage element of the group while the group of storage elements is open to the source line, charges the bit line while the target voltage is applied to the selected storage element, boosts the bit line above a voltage level resulting from charging, and applies a programming voltage to the selected storage element with the group of storage elements open to the bit line to program the selected memory.

35. The non-volatile memory system of claim 34, wherein the managing circuitry charges the bit line based on a current level of programming associated with the selected memory cell.

36. The non-volatile memory system of claim 35, wherein the managing circuitry charges the bit line based on a current level of programming associated with the selected storage element by charging the bit line to a level of the first voltage when a difference between a current threshold voltage of the selected memory cell and the target voltage is greater than the first voltage, and charging the bit line to a level based on the difference between the target voltage and the current threshold voltage of the selected memory cell when the difference is less than the first voltage.

37. The non-volatile memory system of claim 34, wherein the target voltage is a verify level associated with a target state for the selected storage element.

38. The non-volatile memory system of claim 34, wherein:
the selected storage element is coupled to a selected word line;
the selected word line is coupled to a plurality of additional non-volatile storage elements;
the managing circuitry applies the target voltage to the selected word line and applies the programming voltage to the selected word line;
the managing circuitry verifies whether the selected storage element has reached a target state associated with the target voltage after programming the selected storage element and repeats applying the first voltage, applying the target voltage, charging the bit line, boosting the bit line and applying the programming voltage if the selected storage element has not reached the target state;
and the managing circuitry applies an inhibit voltage to the bit line while repeating applying the target voltage and applying the programming voltage during programming for one or more of the additional storage elements if the selected storage element has reached the target state.

39. The non-volatile memory system of claim 38, wherein the managing circuitry increases a magnitude of the programming voltage by a pre-determined step size when applying the programming voltage during the repeating.

40. The non-volatile memory system of claim 34, wherein the managing circuitry boosts the bit line above the voltage level resulting from charging the bit line by applying a boosting voltage to a second bit line adjacent to the selected bit line.

41. The non-volatile memory system of claim 40, wherein:
the second bit line is capacitively coupled to the selected bit line; and
the selected bit line is boosted above the voltage level resulting from charging by an amount based on the capacitively coupling and a magnitude of the boosting voltage.

42. The non-volatile memory system of claim 34, wherein:
the bit line is part of a first set of bit lines; and
the managing circuitry boosts the bit line voltage by holding the voltage level resulting from charging on the bit line, applying a boosting voltage to a second set of bit lines formed adjacent to and between the first set of bit lines, and allowing the voltage level of the bit line to rise in accordance with the boosting voltage applied to the second set of bit lines.

43. The non-volatile memory system of claim 42, wherein the voltage level of the bit line rises in relation to the boosting voltage and a level of capacitively coupling existing between the first set of bit lines and the second set of bit lines.

44. A non-volatile memory system, comprising:
a group of non-volatile storage elements having a channel region;
a bit line associated with the group of storage elements; and
managing circuitry in communication with the group of storage elements and the bit line the programs a selected storage element of the group by source side injection that includes sensing a threshold voltage of the selected storage element, charging the bit line based on the threshold voltage of the selected memory cell, boosting a voltage of the bit line after charging, and transferring at least a portion of the voltage of the bit line into the channel region of the group of storage elements to program the selected storage element.

45. The non-volatile memory system of claim 44, wherein the managing circuitry senses an analog threshold voltage of the selected storage element.

46. The non-volatile memory system of claim 45, wherein the managing circuitry senses an analog threshold voltage by drain source reverse readout.

47. The non-volatile memory system of claim 46, wherein the managing circuitry senses the analog threshold voltage by drain source reverse readout by applying a first voltage to a source line for the group of storage elements, applying a pass voltage to unselected storage elements of the group, opening the group of storage elements to the bit line and the source line, and applying a target threshold voltage to the selected memory cell.

48. The non-volatile memory system of claim 47, wherein the managing circuitry charges the bit line by charging the bit line to the first voltage level when a difference between the target threshold voltage and an actual threshold voltage of the selected storage element is greater than the first voltage level, and charging the bit line to a level of the difference between the target threshold voltage and the actual threshold voltage when the difference is less than the first voltage level.

49. The non-volatile memory system of claim 44, wherein the managing circuitry includes a state machine.

50. The non-volatile memory system of claim 49, wherein the managing circuitry further includes column control circuitry and row control circuitry.

* * * * *